United States Patent
Yoshinaga et al.

(10) Patent No.: US 7,408,818 B2
(45) Date of Patent: Aug. 5, 2008

(54) SEMICONDUCTOR DEVICE UNDERGOING DEFECT DETECTION TEST

(75) Inventors: Kenji Yoshinaga, Itami (JP); Masashi Matsumura, Itami (JP); Futoshi Igaue, Itami (JP); Mihoko Akiyama, Itami (JP); Fukashi Morishita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 11/703,672

(22) Filed: Feb. 8, 2007

(65) Prior Publication Data
US 2007/0183214 A1 Aug. 9, 2007

(30) Foreign Application Priority Data
Feb. 9, 2006 (JP) .............................. 2006-032787

(51) Int. Cl.
*G11C 11/34* (2006.01)
(52) U.S. Cl. .................... 365/189.09; 365/226; 365/201
(58) Field of Classification Search ............ 365/189.09, 365/226, 200
See application file for complete search history.

(56) References Cited

U.S. PATENT DOCUMENTS 5,877,978 A * 3/1999 Morishita et al. ...... 365/189.09

6,205,067 B1 * 3/2001 Tsukude .................... 365/201
7,023,754 B2 * 4/2006 Akiyama et al. ............ 365/226

FOREIGN PATENT DOCUMENTS

| JP | 6-119776 A | 4/1994 |
|---|---|---|
| JP | 7-260874 A | 10/1995 |
| JP | 10-63354 A | 3/1998 |
| JP | 10-92200 A | 4/1998 |
| JP | 11-296241 A | 10/1999 |
| JP | 2002-298599 A | 10/2002 |
| JP | 2004-152399 A | 5/2004 |
| JP | 2005-249661 A | 9/2005 |

* cited by examiner

*Primary Examiner*—Huan Hoang
(74) *Attorney, Agent, or Firm*—McDermott Will & Emery LLP

(57) ABSTRACT

A semiconductor device has a first operation mode and a second operation mode in which power supply with a higher voltage value than that in the first operation mode is provided. The semiconductor device includes a memory portion having memory cells for storing data and a power supply circuit portion supplying a first voltage and a second voltage to the memory portion. The memory portion writes or reads data to or from the memory cells based on the first voltage and the second voltage, and the power supply circuit portion provides a smaller voltage difference between the first voltage and the second voltage in the second operation mode as compared with the voltage difference in the first operation mode.

10 Claims, 32 Drawing Sheets

FIG.11

| | Vg | Vd | Vs | Vgd | Vgs | Vds |
|---|---|---|---|---|---|---|
| NORMAL OPERATION (READ/WRITE) | Vpp(1.6V) | Vneg(-0.6V) | Vpp(1.6V) | Vpp+\|Vneg\|(2.2V) | 0V | Vpp+\|Vneg\|(2.2V) |
| VppVdd BURN-IN OPERATION CONVENTIONAL | Vpp(2.3V) | Vneg(-0.6V) | Vpp(2.3V) | Vpp+\|Vneg\|(2.9V) | 0V | Vpp+\|Vneg\|(2.9V) |
| THE INVENTION | VddT(1.9V) | Vneg(-0.6V) | VddT(1.9V) | VddT+\|Vneg\|(2.5V) | 0V | VddT+\|Vneg\|(2.5V) |

FIG.12

| | Vg | Vd | Vs | Vgd | Vgs | Vds |
|---|---|---|---|---|---|---|
| NORMAL OPERATION (READ/WRITE) | Vpp(1.6V) | Vneg(-0.6V) | Vneg(-0.6V) | Vpp+|Vneg|(2.2V) | Vpp+|Vneg|(2.2V) | 0V |
| VppVdd BURN-IN OPERATION CONVENTIONAL | Vpp(2.3V) | Vneg(-0.6V) | Vneg(-0.6V) | Vpp+|Vneg|(2.9V) | Vpp+|Vneg|(2.9V) | 0V |
| THE INVENTION | VddT(1.9V) | Vneg(-0.6V) | Vneg(-0.6V) | VddT+|Vneg|(2.5V) | VddT+|Vneg|(2.5V) | 0V |

FIG.19

| | Vg | Vd | Vs | Vgd | Vgs | Vds |
|---|---|---|---|---|---|---|
| NORMAL OPERATION (READ/WRITE) | Vpp(1.6V) | Vneg(-0.6V) | Vpp(1.6V) | Vpp+\|Vneg\|(2.2V) | 0V | Vpp+\|Vneg\|(2.2V) |
| VnegGnd BURN-IN OPERATION CONVENTIONAL | Vpp(2.3V) | Vneg(-0.6V) | Vpp(2.3V) | Vpp+\|Vneg\|(2.9V) | 0V | Vpp+\|Vneg\|(2.9V) |
| THE INVENTION | Vpp(2.3V) | Gnd(0V) | Vpp(2.3V) | Vpp(2.3V) | 0V | Vpp(2.3V) |

FIG.20

| | Vg | Vd | Vs | Vgd | Vgs | Vds |
|---|---|---|---|---|---|---|
| NORMAL OPERATION (READ/WRITE) VnegGnd BURN-IN OPERATION | Vpp(1.6V) | Vneg(-0.6V) | Vneg(-0.6V) | Vpp+\|Vneg\|(2.2V) | Vpp+\|Vneg\|(2.2V) | 0V |
| CONVENTIONAL | Vpp(2.3V) | Vneg(-0.6V) | Vneg(-0.6V) | Vpp+\|Vneg\|(2.9V) | Vpp+\|Vneg\|(2.9V) | 0V |
| THE INVENTION | Vpp(2.3V) | Gnd(0V) | Gnd(0V) | Vpp(2.3V) | Vpp(2.3V) | 0V |

FIG.23

| | SN-Vcp VOLTAGE | |
|---|---|---|
| | SN=VddT(H DATA) | SN=Gnd(L DATA) |
| NORMAL OPERATION (READ/WRITE) | 3/8VddT(0.45V) | 5/8VddT(0.75V) |
| BURN-IN OPERATION (CONVENTIONAL) | 3/8VddT(0.7125V) | 5/8VddT(1.1825V) |
| BURN-IN OPERATION (THE INVENTION) VcpVdd MODE | 0V | VddT(1.9V) |
| BURN-IN OPERATION (THE INVENTION) VcpGnd MODE | VddT(1.9V) | 0V |

FIG.26

| | VcpVdd | VcpGnd | Vcp VOLTAGE SUPPLY LINE | SUPPLYING CIRCUIT |
|---|---|---|---|---|
| NORMAL | L LEVEL | L LEVEL | Vcp | Vcp INTERNAL POWER SUPPLY GENERATION CIRCUIT |
| VcpVdd MODE | H LEVEL | L LEVEL | Vdd | Vcp SWITCH CIRCUIT |
| VcpGnd MODE | L LEVEL | H LEVEL | Gnd | Vcp SWITCH CIRCUIT |
| NOT USED | H LEVEL | H LEVEL | FLOATING | NONE |

USED { VcpVdd MODE, VcpGnd MODE }

FIG.28

| | VddL | VddT | Gnd | Vpp | Vneg | Vcp |
|---|---|---|---|---|---|---|
| | SUPPLIED FROM THE OUTSIDE | | | GENERATED BY INTERNAL CIRCUIT | | |
| NORMAL OPERATION (READ/WRITE) | 1.2V | 1.2V | 0V | 1.6V(VddT+0.4V) | -0.6V | 0.75V(5/8×VddT) |
| BURN-IN OPERATION | | | | | | |
| CONVENTIONAL | 1.9V | 1.9V | 0V | 2.3V(VddT+0.4V) | -0.6V | APPROX.1.19V(5/8×VddT) |
| VppVdd BURN-IN (FIRST EMBODIMENT) | 1.9V | 1.9V | 0V | 1.9V(VddT) | -0.6V | APPROX.1.19V(5/8×VddT) |
| VnegGnd BURN-IN (SECOND EMBODIMENT) | 1.9V | 1.9V | 0V | 2.3V(VddT+0.4V) | 0V | APPROX.1.19V(5/8×VddT) |
| VcpVdd BURN-IN (FOURTH EMBODIMENT) | 1.9V | 1.9V | 0V | 2.3V(VddT+0.4V) | -0.6V | 1.9V(VddT) |
| VcpGnd BURN-IN (FOURTH EMBODIMENT) | 1.9V | 1.9V | 0V | 2.3V(VddT+0.4V) | -0.6V | 0V(Gnd) |

SEMICONDUCTOR DEVICE UNDERGOING DEFECT DETECTION TEST

BACKGROUND OF THE INVENTION

1. Field of the Invention

The present invention relates to a semiconductor device, particularly to a semiconductor device on which a defect detection test is performed.

2. Description of the Background Art

Due to the recent progress in semiconductor manufacturing technology, a logic-merged memory has been implemented that has, on the same chip, a logic circuit and a memory and data can be communicated between the logic circuit and the memory. Since such a logic-merged memory can have an improved transfer rate between the logic circuit and the memory, high-speed data processing can be achieved.

In the logic-merged memory, in terms of high-speed operation and power consumption for example, a memory cell configured with a thin-film transistor for logic applications that can provide high performance with a low voltage is used. As for the memory cell structure, a so-called twin cell structure comprised of, for example, two MOS transistors (access transistors) and two capacitors is employed. Further, in most cases, a memory cell is formed with a P-channel MOS transistor whose power consumption due to gate leakage current or the like is approximately one-third as high as that of an N-channel MOS transistor. The thin-film transistor is a transistor having a lower operating voltage relative to an input/output circuit for external elements of the semiconductor device. For example, relative to the operating voltage 3.3 V of the input/output circuit, the operating voltage of the thin-film transistor is 1.2 V.

Here, a description is given about a reliability test for such a device as logic-merged memory. Generally, device failures are roughly divided into three periods that are initial failure period, random failure period and wear-out failure period in order of time. The initial failure refers to a failure occurring immediately after the start of use, due to deficiencies in device manufacturing process. For example, the initial failure includes the state in which the resistance value of a metal interconnection is larger than a standard value and the state in which a memory cell has large leakage current. Such states are not critical defects at the start of use of the device. These defects relevant to tolerances that are failures becoming critical as the device is used belong to the initial failure. The initial failure rate rapidly decreases with time, and subsequently the random failure period starts in which a low failure rate lasts for a certain long period. Then, the wear-out failure period starts in which the end of useful life of the device is being reached and the failure rate sharply increases. It is desirable that the device is used in the random failure period, and the random failure period corresponds to the useful lifetime of the device. Therefore, in order to improve the device reliability, it is required that the random failure period lasts for a long time and the failure rate in the random failure period is low and constant.

In order to remove initial failures in advance, screening is generally carried out by performing accelerated operation aging on the device for a certain time so as to remove defectives. For effectively performing the screening in a short period of time, it is desirable that the initial failure rate immediately decreases in a short period of time and the random failure period starts earlier. Currently, as one of screening methods, high-temperature operation test (burn-in test) is generally conducted.

Generally, in normal operation, an external voltage according to specifications is supplied to the semiconductor device for reading data and writing data for example. In contrast, in burn-in test, a higher external power supply voltage than that in normal operation is supplied to the device. Accordingly, high electric field stress is applied to the device and thus the degree of acceleration of the burn-in test is increased.

In particular, for the state of wafer, wafer level burn-in test is effective. The wafer level burn-in test is a method by which a dielectric film of a transistor or the like can be directly evaluated using the actual device. Various factors of defectives such as short circuit between interconnections can be revealed in accelerated manner by applying high temperature and high electric field stress.

In the case where the memory cell stores H data (data having a logically high level) and the access transistor is OFF for example, application of the same voltage as H data to the gate of the access transistor could be insufficient to cause electric charges stored in the memory cell capacitor to flow out from the gate, resulting in flow of off-leakage current. This is a problem for a thin film transistor having a small gate voltage for turning the transistor ON. Therefore, when the access transistor is OFF, a voltage higher than the level of H data has to be supplied to the gate of the access transistor.

Further, for the logic-merged memory having a memory cell whose access transistor is P-channel MOS transistor, a negative voltage has to be supplied to the gate of the access transistor in order to write L data (data having a logically low level) to the memory cell.

Therefore, within the device, it is necessary to generate a voltage higher than the level of H data as well as a negative voltage from an external power supply voltage and supply the generated voltages to the memory cell. Then, for example, excessive stress could be imposed between electrodes, for example, between the gate and drain and between the gate and source of the transistor provided in the output stage of the supply voltage to the memory cell for example.

Furthermore, since the external power supply voltage in burn-in test is larger than that in normal operation as described above, further excessive stress is imposed on the transistor, which could cause the gate oxide film of the transistor to be broken.

In contrast, a semiconductor device disclosed in Japanese Patent Laying-Open No. 10-092200 (Patent Document 1) is configured to accelerate initial defects by applying a cell plate voltage in burn-in test that is different from the one in normal operation. However, no measures are taken to address malfunctions due to a larger voltage difference between two voltages supplied to a memory cell or the like. Further, a semiconductor device disclosed in Japanese Patent Laying-Open No. 2002-298599 (Patent Document 2) is configured to accelerate initial defects by making switch between a plurality of internal power supplies in normal operation and burn-in operation. However, no measures are taken to address malfunctions due to a voltage difference between two voltages supplied to a memory cell or the like.

Therefore, for the semiconductor devices disclosed in Patent Documents 1 and 2, it is necessary to provide a lower external power supply voltage in burn-in test for avoiding breakage of the thin film transistor. Thus, high electric field stress cannot be applied to the device, resulting in the problem that the burn-in test takes a long time. In addition, since the external power supply voltage cannot be increased, stress for revealing initial failures cannot be applied to the gate oxide film for example of the transistor, resulting in the problem that initial defectives cannot be removed sufficiently.

Moreover, a voltage different from that in normal operation may be externally supplied in burn-in test so as to apply high electric field stress to the device and thereby shorten the burn-in test time. However, a pad for applying a power supply voltage except for the external power supply voltage for normal operation has to be provided, which could increase the circuit size and area.

SUMMARY OF THE INVENTION

An object of the present invention is to provide a semiconductor device on which such a defect detection test as burn-in test can be performed appropriately.

According to an aspect of the present invention, a semiconductor device has a first operation mode and a second operation mode in which a positive voltage and a ground voltage are externally supplied and the positive voltage in the second operation mode is higher than the positive voltage in the first operation mode. The semiconductor device includes: a memory portion including a memory cell storing data; and a power supply circuit portion supplying a first voltage and a second voltage to the memory portion. The memory portion writes data to or reads data from the memory cell based on the first voltage and the second voltage. The power supply circuit portion includes: a boosted voltage generation circuit generating, based on the externally supplied positive voltage and ground voltage, a boosted voltage of the positive voltage; a negative voltage generation circuit generating a negative voltage based on the externally supplied positive voltage and ground voltage; and a switch circuit supplying, in the first operation mode, the boosted voltage as the first voltage and the negative voltage as the second voltage to the memory portion, and providing, in the second operation mode, a smaller voltage difference between the first voltage and the second voltage relative to the first operation mode.

According to another aspect of the present invention, a semiconductor device has a first operation mode and a second operation mode in which a positive voltage and a ground voltage are externally supplied and the positive voltage in the second operation mode is higher than the positive voltage in the first operation mode. The semiconductor device includes: a memory portion including a memory cell storing data; and a power supply circuit portion supplying a voltage to the memory portion. The memory cell stores electric charge according to a logic level of data and includes a first memory cell capacitor and a second memory cell capacitor having a common electrode. The power supply circuit portion includes: a cell plate voltage generation circuit generating a cell plate voltage based on the externally supplied positive voltage and ground voltage; and a cell plate voltage switch circuit supplying the cell plate voltage to the common electrode of the first and second memory cell capacitors in the first operation mode and supplying a voltage higher or lower than the cell plate voltage to the common electrode in the second operation mode.

In accordance with the present invention, such a defect detection test as burn-in test can be conducted appropriately.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 shows voltages of the transistor enclosed by the circle drawn by the dotted line in FIG. 10, in normal operation and in burn-in test.

FIG. 12 shows voltages of the transistor enclosed by the circle drawn by the long and short dashed line in FIG. 10, in normal operation and in burn-in test operation.

FIG. 19 shows voltages of the transistor enclosed by the circle drawn by the dotted line in FIG. 10, in normal operation and in burn-in test.

FIG. 20 shows voltages of the transistor enclosed by the circle drawn by the long and short dashed line in FIG. 10, in normal operation and in burn-in test.

FIG. 23 shows transition of storage-node—Vcp voltage in normal operation and in burn-in test.

FIG. 26 shows a relation between a burn-in signal and a voltage supplied to a Vcp voltage supply line.

FIG. 28 shows transitions of an externally supplied voltage and a voltage generated in an internal circuit in normal operation and in burn-in test of the semiconductor devices according to the first, second and fourth embodiments of the present invention.

DESCRIPTION OF THE PREFERRED EMBODIMENTS

Figure 1:
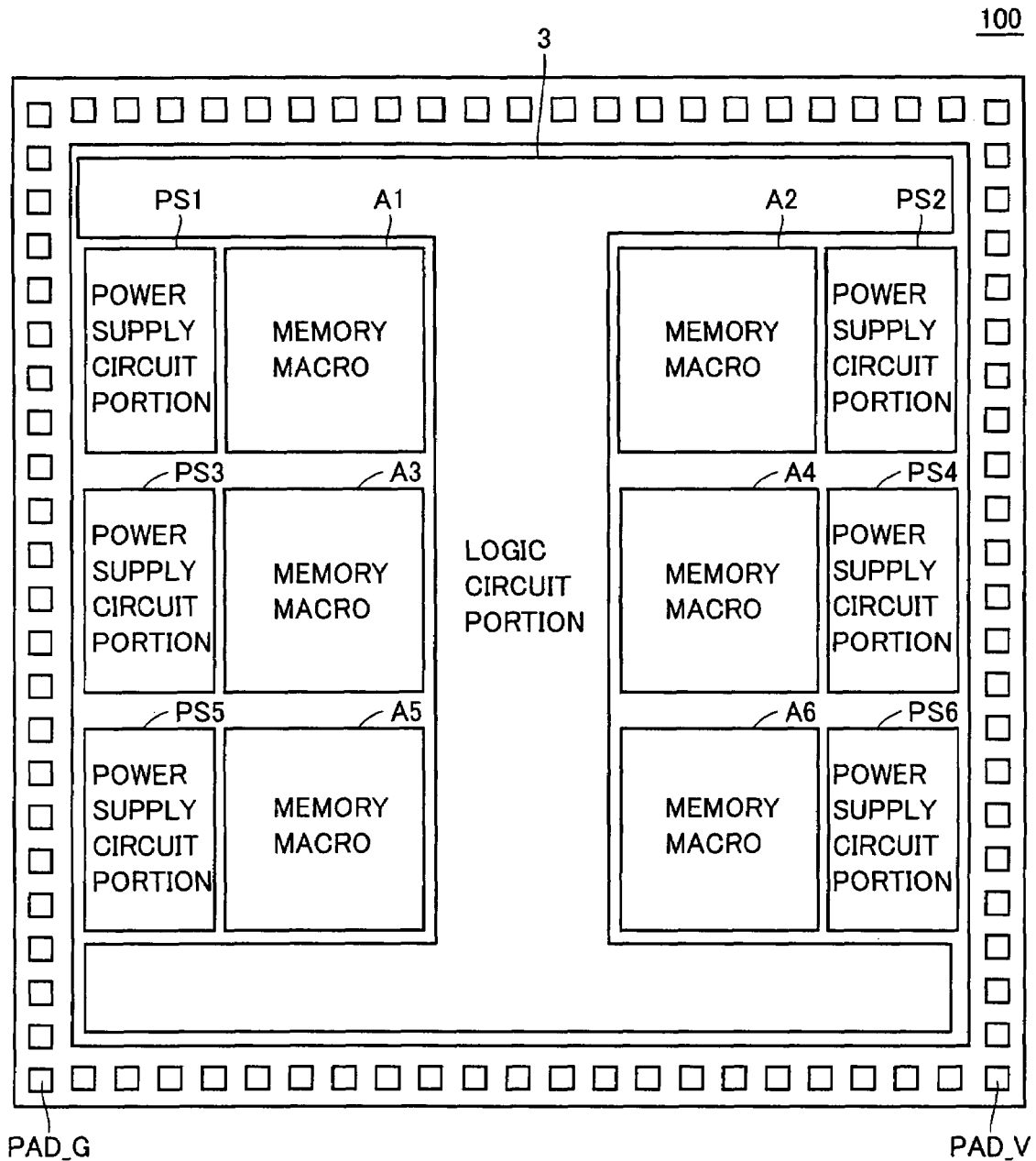
FIG. 1 is a schematic diagram showing an arrangement of a semiconductor device according to a first embodiment of the present invention.

In the following, embodiments of the present invention are described in connection with the drawings. In the drawings, like or corresponding components are denoted by like reference characters and a description thereof is not repeated.

First Embodiment

FIG. 1 schematically shows an arrangement of a semiconductor device according to a first embodiment of the present invention.

Referring to FIG. 1, the semiconductor device is a logic-merged memory for example and includes a logic circuit portion 3, memory macros (memory portions) A1 to A6 and power supply circuit portions PS1 to PS6. Logic circuit portion 3, memory macros A1 to A6 and power supply circuit portions PS1 to PS6 are arranged on the same chip. Around logic circuit portion 3, memory macros A1 to A6 and power supply circuit portions PS1 to PS6, pads are successively arranged for externally supplying power from the outside of the semiconductor device. For example, external power supply voltage VddT and ground voltage GND are supplied via pad PAD_V and pad PAD_G to the semiconductor device.

The semiconductor device has a first operation mode corresponding to normal operation in which data is externally written to and read from the semiconductor device, and a second operation mode such as burn-in test in which an external power supply voltage higher than that in the first operation mode is supplied.

Logic circuit portion 3 includes such components as CPU (Central Processing Unit), analog-digital converter and digital-analog converter (not shown). Logic circuit portion 3 performs logical operation or the like, based on input data.

Memory macros A1 to A6 are arranged adjacently to logic circuit portion 3, store data received from logic circuit portion 3 and from the outside of the semiconductor device, and output the stored data to logic circuit portion 3 and to the outside of the semiconductor device.

Power supply circuit portions PS1 to PS6 are arranged to be associated with memory macros A1 to A6 respectively, generate an internal power supply voltage based on external power supply voltage VddT and ground voltage GND and supply the generated voltage to memory macros A1 to A6.

Figure 2:
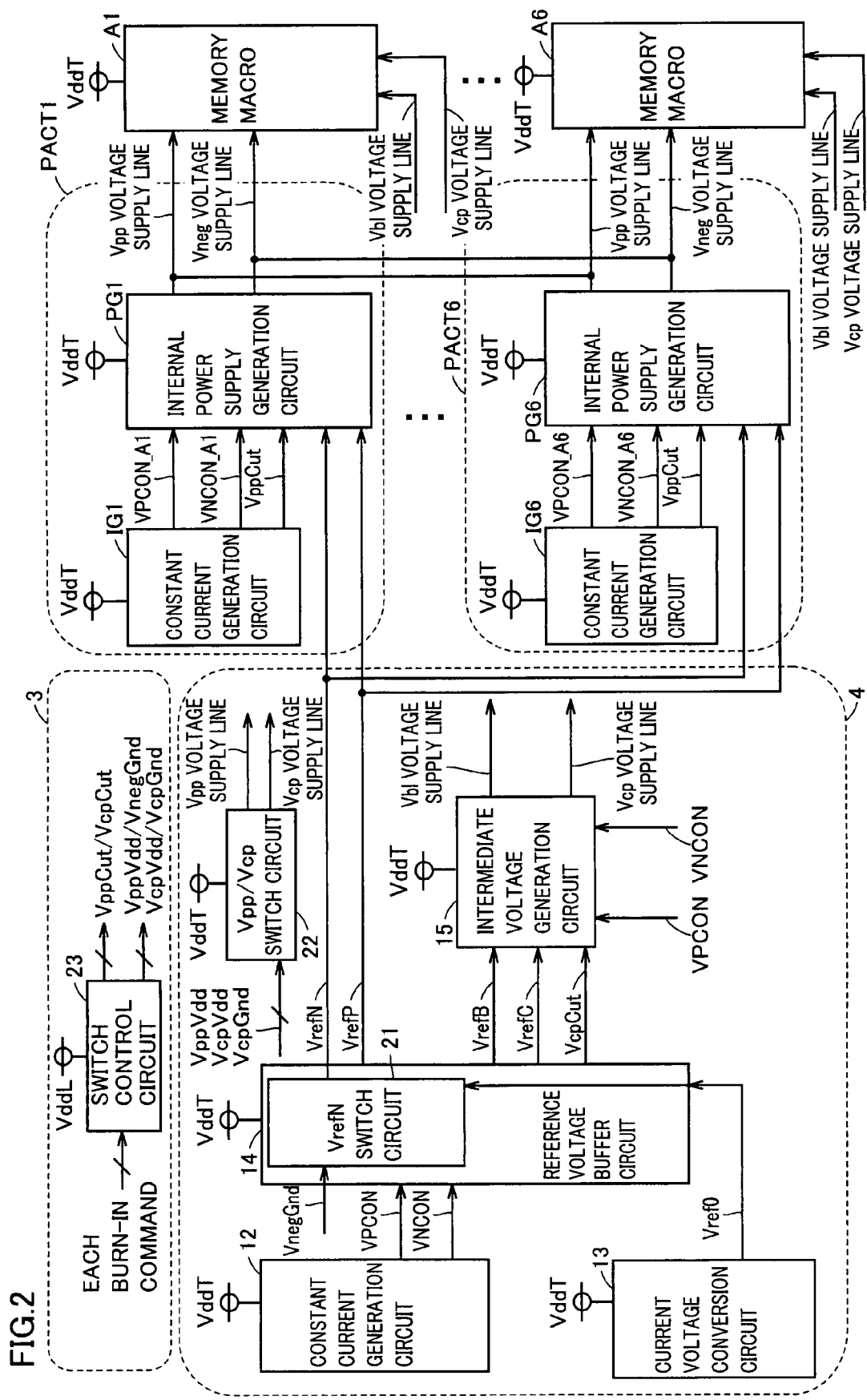
FIG. 2 shows a configuration of the semiconductor device according to the first embodiment of the present invention.

FIG. 2 shows a configuration of the semiconductor device according to the first embodiment of the present invention.

Referring to FIG. 2, power supply circuit portions PS1 to PS6 include respective power supply active circuits PACT1 to PACT6 and a power supply standby circuit 4.

Power supply active circuits PACT1 to PACT6 include constant current generation circuits IG1 to IG6 and internal power supply generation circuits PG1 to PG6. Internal power supply generation circuit PG includes a Vpp internal power supply generation circuit (not shown in the drawing) generating boosted voltage Vpp based on external power supply voltage VddT and ground voltage GND and a Vneg internal power supply generation circuit (not shown in the drawing) generating negative voltage Vneg based on external power supply voltage VddT and ground voltage GND. Logic circuit portion 3 includes a switch control circuit 23.

Power supply standby circuit 4 includes a constant current generation circuit 12, a current voltage conversion circuit 13, a reference voltage buffer circuit 14, an intermediate voltage generation circuit 15, and a Vpp/Vcp switch circuit 22. Buffer circuit 14 includes a VrefN switch circuit 21. Intermediate voltage generation circuit 15 includes a Vcp internal power supply generation circuit (not shown in the drawing) generating intermediate voltage Vcp based on external power supply voltage VddT and ground voltage GND and a Vbl internal power supply generation circuit (not shown in the drawing) generating intermediate voltage Vbl based on external power supply voltage VddT and ground voltage GND. Further, Vpp/Vcp switch circuit 22 includes a Vpp switch circuit and a Vcp switch circuit (not shown in the drawing).

Power supply active circuits PACT1 to PACT6 are arranged to be associated with memory macros A1 to A6 respectively, and supply to memory macros A1 to A6 boosted voltage Vpp and negative voltage Vneg based on reference voltage VrefN and reference voltage VrefP. Internal circuits included in power supply standby circuit 4 are separately arranged at power supply circuit portions PS1 to PS6. Power supply standby circuit 4 generates reference voltage VrefN and reference voltage VrefP to output them to power supply active circuits PACT1 to PACT6. Further, power supply standby circuit 4 generates intermediate voltage Vbl and intermediate voltage Vcp to supply them to memory macros A1 to A6.

Memory macros A1 to A6 are driven with external power supply voltage VddT supplied from the outside of the semiconductor device, boosted voltage Vpp and negative voltage Vneg supplied from internal power supply generation circuits PG1 to PG6 and intermediate voltage Vbl and intermediate voltage Vcp supplied from intermediate voltage generation circuit 15.

Constant current generation circuit 12 generates constant current VPCON and constant current VNCON based on external power supply voltage VddT to output them to reference voltage buffer circuit 14 and intermediate voltage generation circuit 15.

Current voltage conversion circuit 13 generates reference voltage Vref0 based on external power supply voltage VddT to output the voltages to reference voltage buffer circuit 14.

Reference voltage buffer circuit 14 generates reference voltage VrefN and reference voltage VrefP based on constant current VPCON and constant current VNCON from constant current generation circuit 12 to output them to power supply active circuits PACT1 to PACT6.

Figure 3:
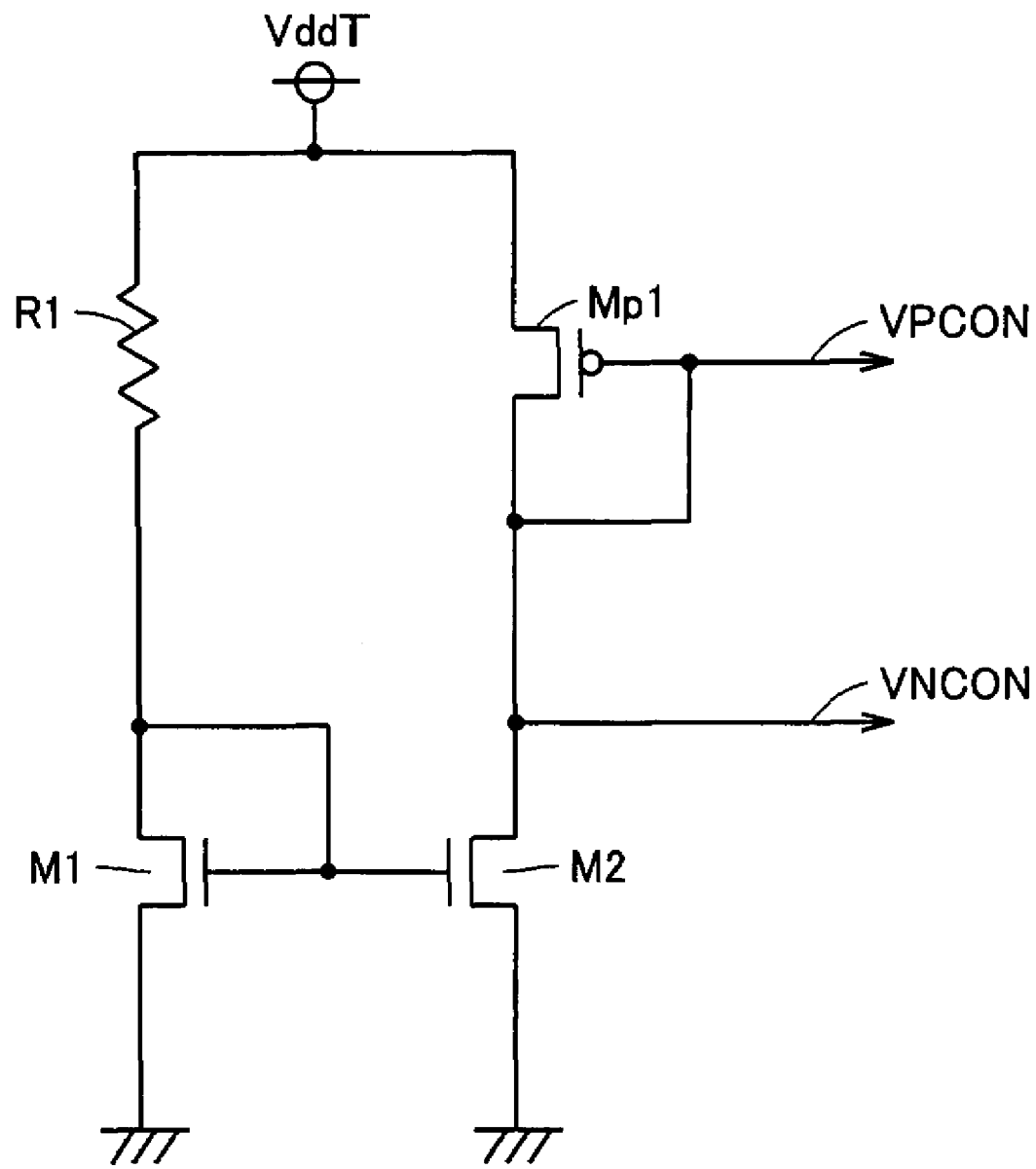
FIG. 3 is a circuit diagram showing a configuration of a constant current generation circuit according to the first embodiment of the present invention.

FIG. 3 is a circuit diagram showing a configuration of the constant current generation circuit according to the first embodiment of the present invention.

Referring to FIG. 3, constant current generation circuit 12 includes a resistor R1, N-channel MOS transistors M1 to M2 and a P-channel MOS transistor Mp1.

The drain and gate of N-channel MOS transistor M1, one end of resistor R1 and the gate of N-channel MOS transistor M2 are connected. The other end of resistor R1 and the source of P-channel MOS transistor Mp1 are connected to external power supply voltage VddT. The source of N-channel MOS transistor M1 and the source of N-channel MOS transistor M2 are connected to ground voltage GND. The drain of N-channel MOS transistor M2 and the drain and gate of P-channel MOS transistor Mp1 are connected to a common connection point. The current at the common connection point is output as constant current VPCON and constant current VNCON to reference voltage buffer circuit 14.

For example, P-channel MOS transistor Mp1 and a P-channel MOS transistor included in reference voltage buffer circuit 14 may constitute a current mirror circuit so that current based on the drain current of P-channel MOS transistor Mp1 flows to the P-channel MOS transistor of reference voltage buffer circuit 14.

Figure 4:
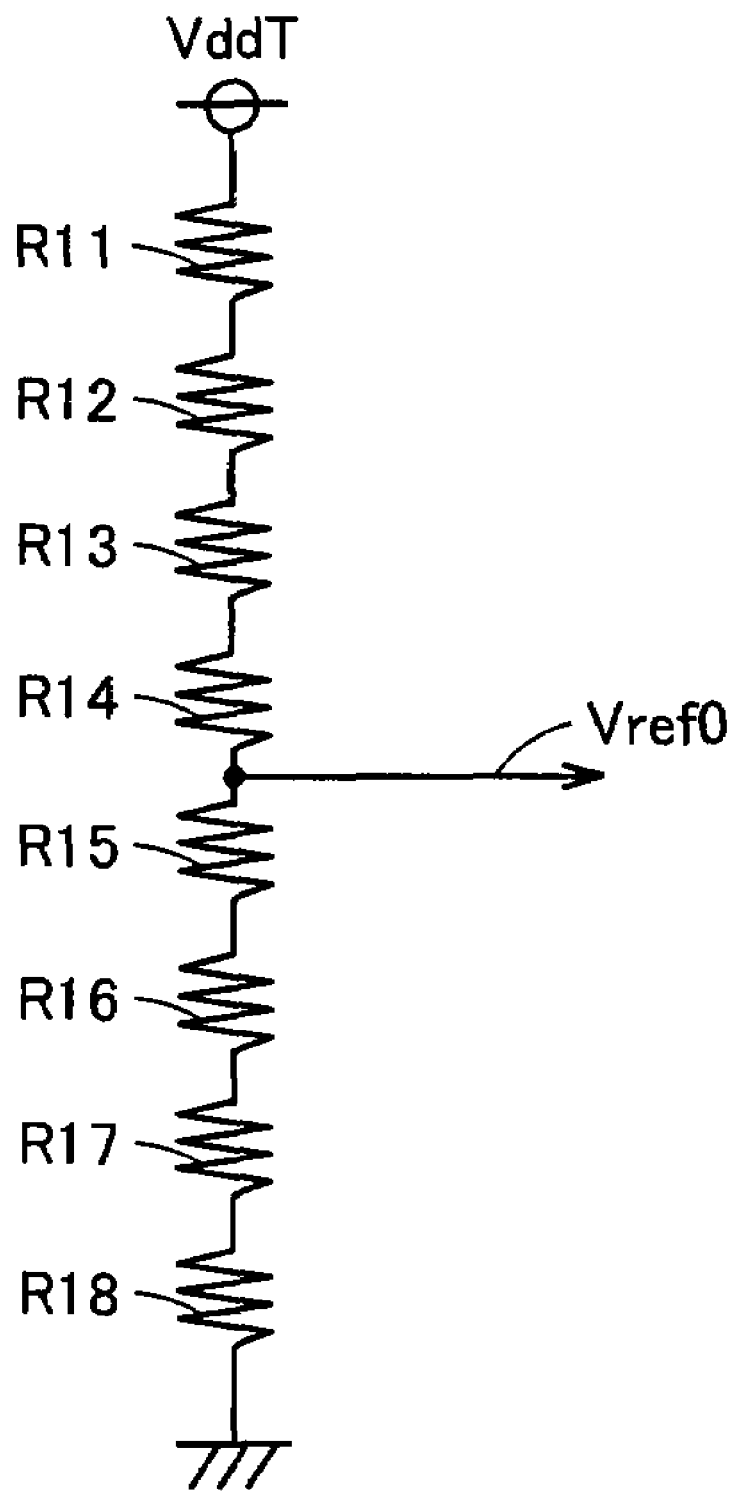
FIG. 4 is a circuit diagram showing a configuration of a current voltage conversion circuit according to the first embodiment of the present invention.

FIG. 4 is a circuit diagram showing a configuration of the current voltage conversion circuit according to the first embodiment of the present invention.

Referring to FIG. 4, current voltage conversion circuit 13 includes resistors R11 to R18. Resistors R11 to R18 have the same resistance values for example, and the eight resistors are connected in series between external power supply voltage VddT and ground voltage GND. At the connection point between resistor R14 and resistor R15, the current voltage conversion circuit generates reference voltage Vref0 equal to ½×VddT to output the voltage to reference voltage buffer circuit 14.

Referring again to FIG. 2, switch control circuit 23 is configured with a standard cell and controls each switch circuit. To switch control circuit 23, an external power supply voltage VddL for logic applications is supplied from the outside of the semiconductor device. Switch control circuit 23 includes a Vpp switch control circuit 23_P, a VrefN switch control circuit 23_N (or VrefN switch control circuit 23_NP) and a Vcp switch control circuit 23_C which are described hereinlater. Switch control circuit 23 receives Vpp burn-in command, Vcp burn-in command, Vneg burn-in command, Vpp cut command and Vcp cut command to output burn-in signal VppVdd, burn-in signal VcpVdd and burn-in signal VcpGnd for controlling Vpp/Vcp switch circuit 22, burn-in signal VnegGnd for controlling VrefN switch circuit 21, cut signal VppCut for controlling internal power supply generation circuit PG and cut signal VcpCut for controlling intermediate voltage generation circuit 15.

Reference voltage buffer circuit 14 generates reference voltage VrefP, reference voltage VrefN, reference voltage VrefB and reference voltage VrefC based on reference voltage Vref0 supplied from current voltage conversion circuit 13 and external power supply voltage VddT for example, increases the driving ability by a buffer circuit (not shown), and outputs the voltages to power supply active circuits PACT1 to PACT6 and intermediate voltage generation circuit 15.

Intermediate voltage generation circuit 15 generates, based on reference voltages VrefB and VrefC generated by reference voltage buffer circuit 14, external power supply voltage VddT and constant currents VPCON and VNCON, intermediate voltage Vbl that is ½×VddT and intermediate voltage Vcp that is ⅝ VddT for example to supply the voltages to memory macros A1 to A6. Here, intermediate voltage Vbl is a precharge voltage for precharging a bit line of the memory macro, and intermediate voltage Vcp is a cell plate voltage to be supplied to a memory cell included in the memory macro.

Constant current generation circuits IG1 to IG6 are configured similarly to constant current generation circuit 12 of power supply standby circuit 4, and generate respective constant currents VPCON_A1 to VPCON_A6 and constant currents VNCON_A1 to VNCON_A6 to output them to internal power supply generation circuits PG1 to PG6. Thus, each power supply active circuit PACT has constant current generation circuit IG, so that the length of the line for supplying constant currents VPCON_A1 to VPCON_A6 and constant currents VNCON_A1 to VNCON_A6 can be shortened and noise immunity can be improved.

Internal power supply generation circuits PG1 to PG6 generates boosted voltage Vpp and negative voltage Vneg based on reference voltage VrefP and reference voltage VrefN received from reference voltage buffer circuit 14, external power supply voltage VddT, and constant currents VPCON and VNCON. Here, boosted voltage Vpp is a voltage applied to a Vpp voltage supply line in the case where a word line is to be kept in standby state. Negative voltage Vneg is a voltage applied to a Vneg voltage supply line in the case where a word line is to be activated to read data from and write data to a memory cell of memory macros A1 to A6.

In the semiconductor device of the first embodiment of the present invention, VrefN switch circuit 21 and Vpp/Vcp switch circuit 22 may be provided in centralized manner in one of power supply circuit portions PS1 to PS6 so that the area efficiency of the semiconductor device can be improved. Further, switch control circuit 23 is provided in logic circuit 3 so that the logical operation for generating the burn-in signal and cut signal can be performed by any circuit in a relatively former circuit and the circuit can be simplified and decreased in area.

For example, it is necessary that burn-in signal VppCut has to be activated in Vpp cut mode or in Vpp burn-in test. Therefore, an OR circuit is necessary. If switch control circuit 23 is provided in power supply circuit portions PS1 to PS6, any number of OR circuits corresponding to the number of power supply circuit portions are necessary. However, since it is provided in logic circuit 3 and used as a common circuit, the number of OR circuits can be reduced to one.

Figure 5:
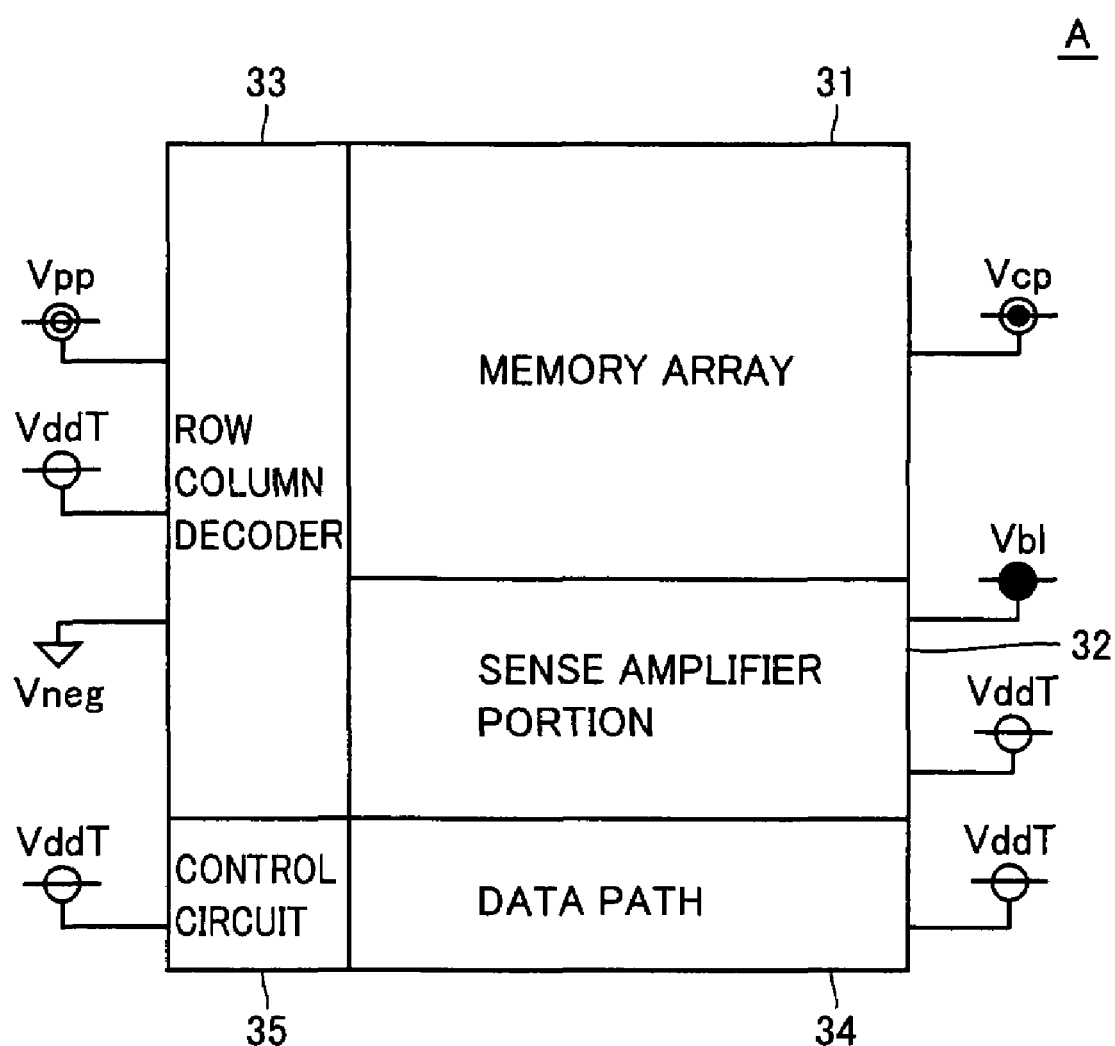
FIG. 5 schematically shows a configuration of a memory macro according to the first embodiment of the present invention.

FIG. 5 schematically shows a configuration of the memory macro according to the first embodiment of the present invention.

Referring to FIG. 5, the memory macro of the first embodiment of the present invention includes a memory array 31, a sense amplifier portion 32, a row column decoder 33, a data path 34 and a control circuit 35.

Memory array 31 includes a plurality of memory cells arranged in rows and columns. According to an address signal indicating the row address and the column address of memory array 31, a memory cell is selected and data writing and data reading are carried out. In the following description, the direction in which word line WL extends is referred to as row direction and the direction in which bit line BL extends is referred to as column direction.

Row column decoder 33 selects, based on a control signal from control circuit 35, a memory cell (hereinafter also referred to select memory cell) to/from which data is to be written/read, from memory cells constituting memory array 31.

Sense amplifier portion 32 detects, based on a control signal from control circuit 35, a very small potential difference generated on the two ends of paired bit lines associated with the select memory cell.

Data path 34 provides, based on a control signal from control circuit 35, data received from logic circuit portion 3 and a logic circuit for example on the outside of the semiconductor device, to the paired bit lines via sense amplifier portion 32. Further, data path 34 outputs a data value corresponding to the potential difference detected by sense amplifier portion 32 to logic circuit portion 3 and to the outside of the semiconductor device.

Control circuit 35 receives an address signal indicating the select memory cell and a command signal indicating such operation of the memory macro as data writing or data reading, and outputs a control signal to row column decoder 33, data path 34 and sense amplifier portion 32.

Figure 6:
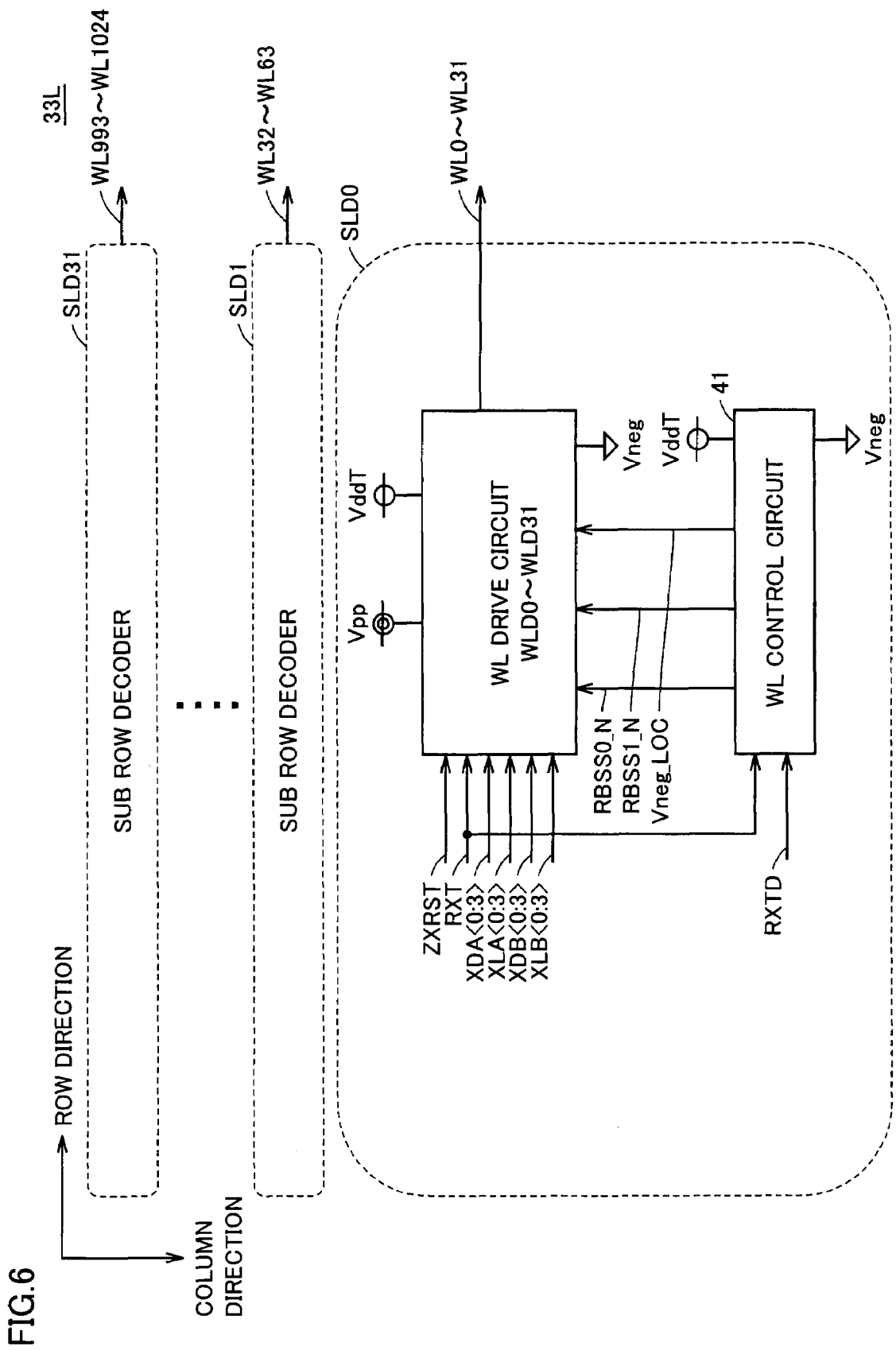
FIG. 6 schematically shows a configuration of a row decoder included in a row column decoder shown in FIG. 5.

FIG. 6 schematically shows a configuration of a row decoder included in the row column decoder shown in FIG. 5.

Referring to FIG. 6, row decoder 33L includes sub row decoders SLD0 to SLD31 arranged along the column direction of memory array 31.

Sub row decoders SLD0 to SLD31 include WL drive circuits WLD0 to WLD31 and a WL control circuit 41 controlling WL drive circuits WLD0 to WLD31.

In the case where a transistor of a memory cell is a P-channel MOS transistor, in order to write data of GND level to the memory cell, a word line associated with the select memory cell (hereinafter also referred to as select word line) is driven to a voltage level lower than ground voltage GND. This word line drive method used here is called negative voltage word line method. According to the negative voltage word line method, a non-select word line is kept at the level of boosted voltage Vpp.

Figure 7:
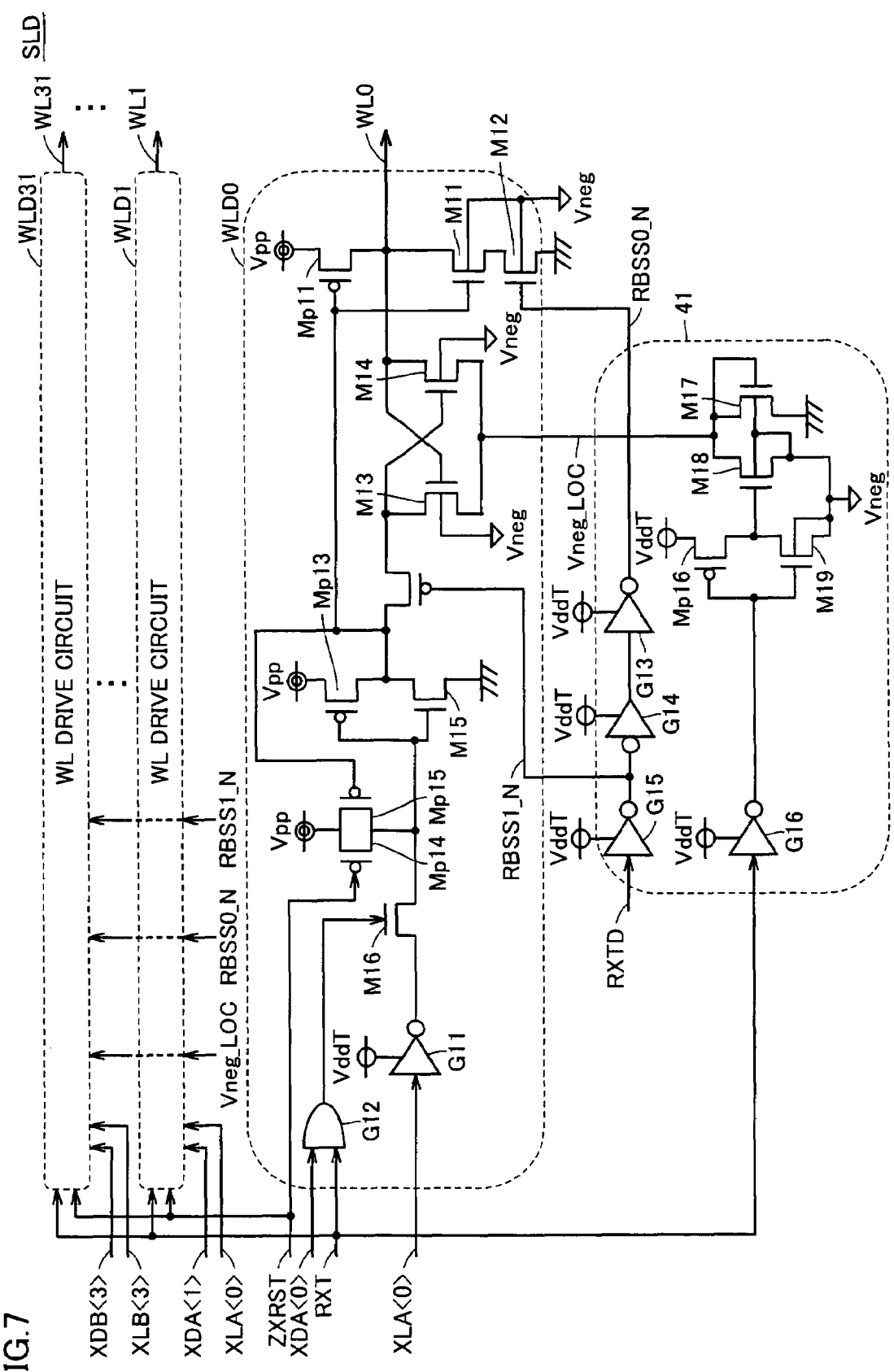
FIG. 7 shows in detail a configuration of a sub row decoder SLD and a WL control circuit shown in FIG. 6.

FIG. 7 shows in detail a configuration of sub row decoder SLD and the WL control circuit. In FIG. 7, the configuration of sub row decoder SLD0 which is one of sub row decoders SLD0 to SLD31 is representatively shown.

Referring to FIG. 7, sub row decoder SLD includes N-channel MOS transistors M11 to M16, P-channel MOS transistors Mp11 to Mp15, an inverter G11 and an AND gate G12. The power supply level of inverter G11 and AND gate G12 is external power supply voltage VddT.

Inverter G11 inverts the logic level of predecode signal XLA and outputs the resultant signal to the drain of N-channel MOS transistor M16. AND gate G12 outputs an AND of predecode signal XDA and word line select signal RXT to the gate of N-channel MOS transistor M16.

To the gate of P-channel MOS transistor Mp14, reset signal ZXRST is input. The drains of P-channel MOS transistors Mp14 to Mp15, the source of N-channel MOS transistor M16, the gate of P-channel MOS transistor Mp13 and the gate of N-channel MOS transistor M15 are connected. The gate of P-channel MOS transistor Mp15, the drain of P-channel MOS transistor Mp13, the drain of N-channel MOS transistor M15, the source of P-channel MOS transistor Mp12, the gate of P-channel MOS transistor Mp11 and the gate of N-channel MOS transistor M11 are connected to a common connection point. The gate of P-channel MOS transistor Mp12 is connected to; RMSS1_N line. The source of N-channel MOS transistor M13 and the source of N-channel MOS transistor M14 are connected to Vneg_LOC line. The gate of N-channel MOS transistor M14, the drain of N-channel MOS transistor M13 and the drain of P-channel MOS transistor Mp12 are connected. The gate of N-channel MOS transistor M12 is connected to RMSS0_Nline. The gate of N-channel MOS transistor M13, the drain of N-channel MOS transistor M14, the drain of N-channel MOS transistor M11 and the drain of P-channel MOS transistor Mp11 are connected to word line WL.

The sources of P-channel MOS transistors Mp11, Mp13 to Mp15 are connected to boosted voltage Vpp. The sources of N-channel MOS transistors M12, M15 are connected to ground voltage GND. The back gates (wells) of N-channel MOS transistors M11 to M14 are connected to negative voltage Vneg.

WL control circuit 41 includes N-channel MOS transistors M17 to M19, a P-channel MOS transistor Mp16 and inverters G13 to G16. The power supply level of inverters G13 to G16 is external power supply voltage VddT.

Inverter G15 inverts the logic level of word line select delay signal RXTD and supplies the resultant signal to RBSS1_N line. The signal supplied to RBSS1_N line is supplied to RBSS0_N line via inverters G13 to G14 with the same logic level.

Inverter G16 inverts the logic level of word line select signal RXT and outputs the resultant signal to the gate of P-channel MOS transistor Mp16 and the gate of N-channel MOS transistor M19.

The drain of P-channel MOS transistor Mp16, the drain of N-channel MOS transistor M19 and the gate of N channel MOS transistor M18 are connected. The drain of N-channel MOS transistor M18 and the drain and gate of N-channel MOS transistor M17 are connected to Vneg_LOC line.

The source of P-channel MOS transistor Mp16 is connected to external power supply voltage VddT. The source of N-channel MOS transistor M17 is connected to ground voltage GND. The back gates, namely wells (substrate) of N-channel MOS transistors M17 to M19 are connected to negative voltage Vneg.

When data is read from and data is written to the select memory cell, the word line associated with the select memory cell is driven into select state. Namely, based on the address signal, a row of memory array 31 is selected and sub row decoder SLD associated with the selected row is selected.

To WL control circuit 41 of sub row decoder SLD associated with the select word line, word line select signal RXT of VddT level (H level) is input from control circuit 35. Then, N-channel MOS transistor M18 is ON so that negative voltage Vneg is supplied to Vneg_LOC line.

In contrast, to WL control circuit 41 of sub row decoder SLD associated with a non-select word line, word line select signal RXT of GND level is input. Then, N-channel MOS transistor M18 is OFF so that the potential on Vneg_LOC line has threshold voltage Vthn of N-channel MOS transistor M17.

Namely, sub row decoder SLD associated with the select word line drives Vneg_LOC line to negative voltage Vneg. Sub row decoder SLD associated with the non-select word line sets the potential of Vneg_LOC line to Vthn level. Thus, depending on whether it is associated with a select word line or non-select word line, namely depending on whether sub row decoder SLD is selected or non-selected, the voltage level of Vneg_LOC line is changed. Thus, in the non-select state (standby state) which is longer in time than the select state, voltage Vgs applied between the gate and source of N-channel MOS transistor M13 can be reduced from "Vpp+ |Vneg|" to "Vpp−Vthn" and accordingly the breakage of the gate insulating film of the transistor can be prevented.

Figure 8:
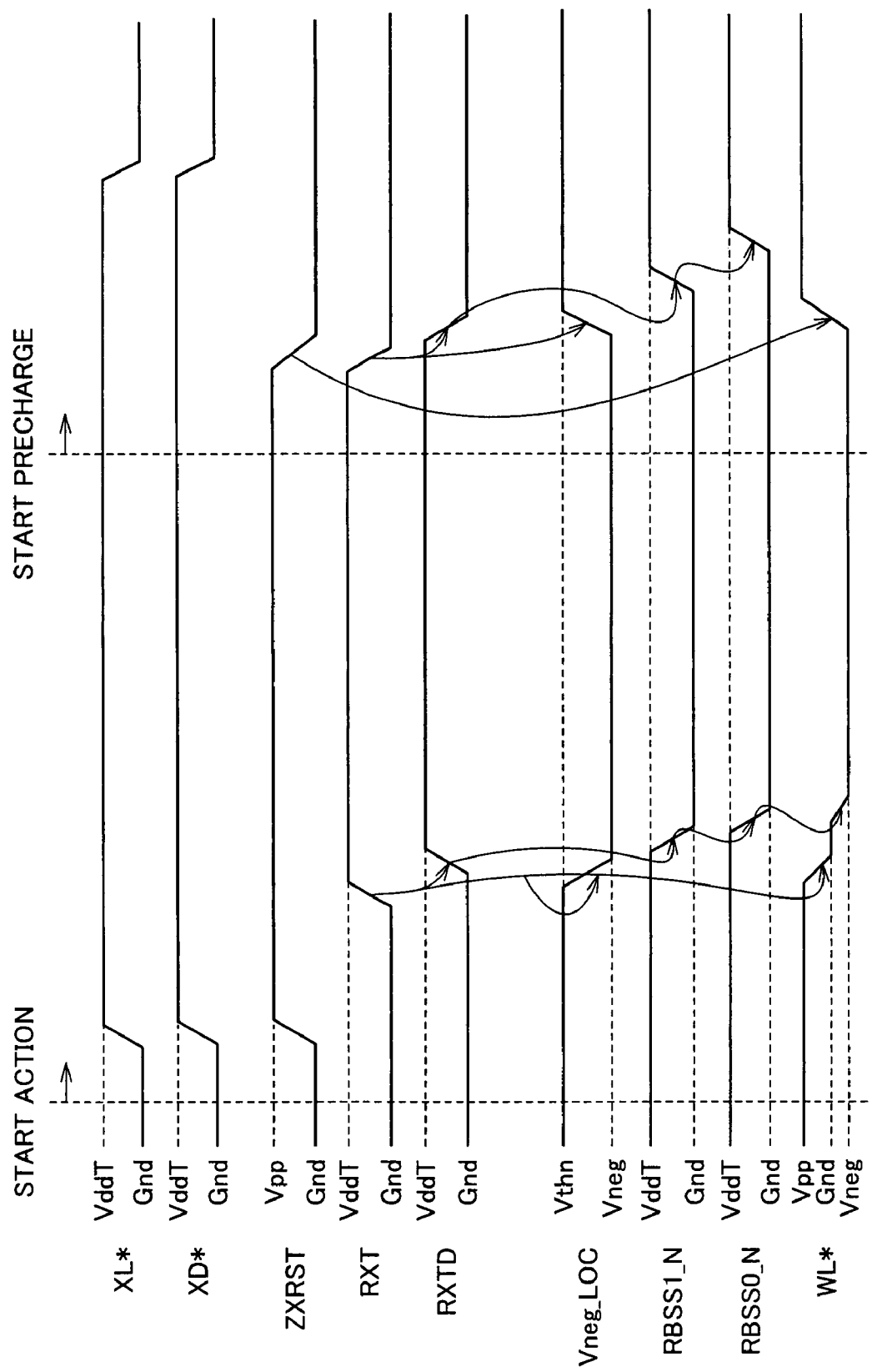
FIG. 8 is a timing waveform diagram for main signals of sub row decoder SLD.

FIG. 8 is a timing waveform diagram for main signals of sub row decoder SLD. In the following description, it is supposed that a word line associated with a select memory cell is word line WL0.

Referring to FIG. 8, in the case where WL drive circuit WLD0 that drives word line WL0 into select state is selected, reset signal ZXRST generated by control circuit 35 or supplied from the outside via control circuit 35, word line select signal RXT and predecode signals XDA <0> and XLA <0> are driven to VddT level. Then, N-channel MOS transistor M11 of WL drive circuit WLD0 is ON and P-channel MOS transistor Mp11 is OFF.

Further, from control circuit 35, word line select delay signal RXTD is input. Since word line select delay signal RXTD is a signal that is word line select signal RXT passing through a delay cell (not shown), word line select signal RXT has VddT level while word line select delay signal RXTD has GND level for the period corresponding to delay time of the delay cell from the time when word line select signal RXT changes from GND level to VddT level. In this predetermined period, RBSS0_N has VddT level and N-channel MOS transistor M12 is ON so that the voltage level of word line WL0 drops from boosted voltage Vpp to ground voltage GND level to cause word line WL0 to be in select state. Accordingly, reading of H data stored in the select memory cell is started.

Furthermore, when the period in which word line select signal RXT has VddT level and word line select delay signal RXTD has GND level has passed and word line select signal RXT and word line select delay signal RXTD both have VddT level, RBSS0_N has GND level. Therefore, N-channel MOS transistor M12 is OFF and GND level is not transmitted to word line WL0. Meanwhile, RBSS1_N has GND level so that P-channel MOS transistor Mp12 and N-channel MOS transistor M14 are ON. Accordingly, negative voltage Vneg is supplied to word line WL0 so that word line WL0 is still in the select state and reading of L data stored in the select memory cell is started.

Figure 9:
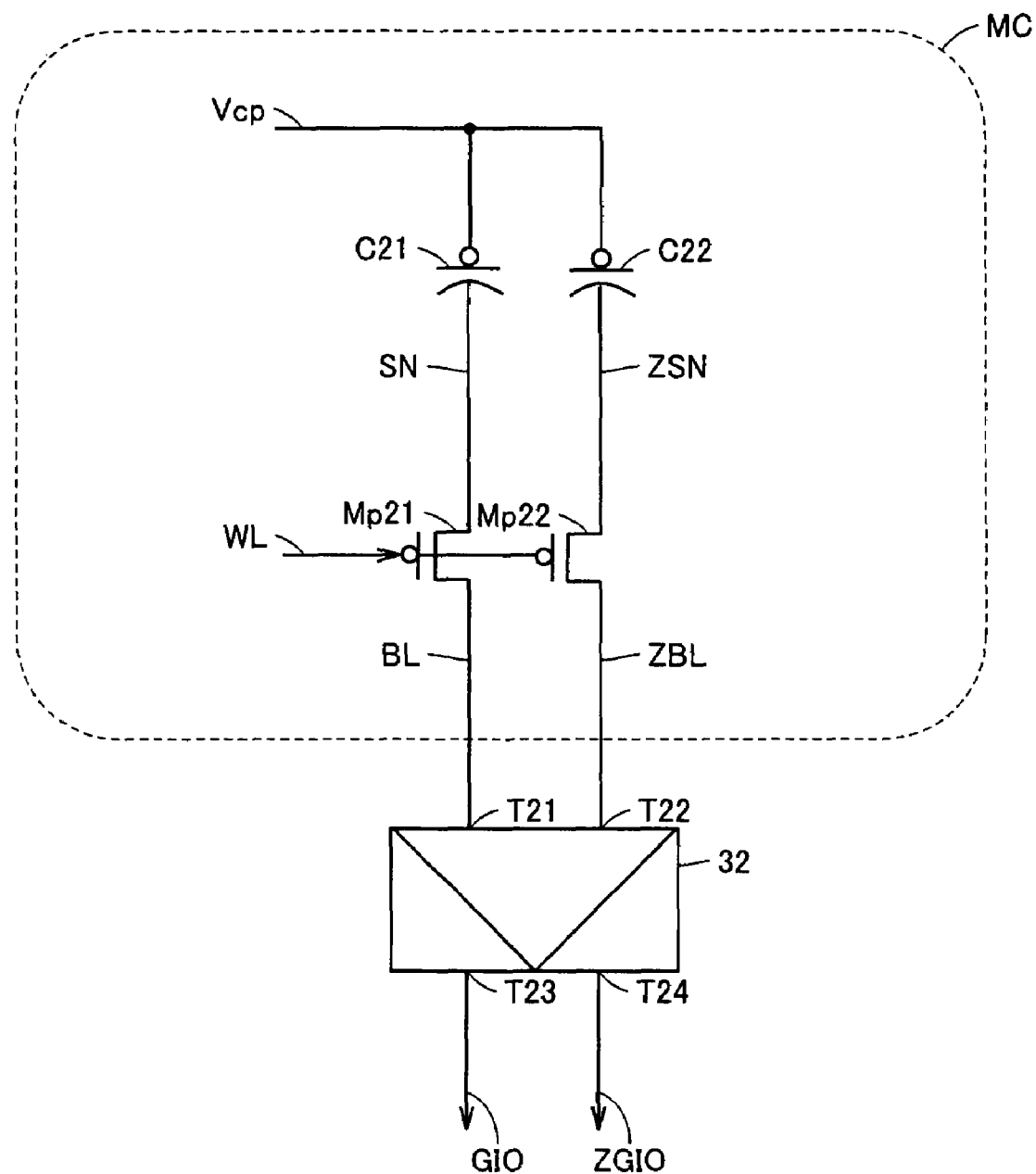
FIG. 9 shows a configuration of a memory cell corresponding to 1-bit data.

FIG. 9 shows a configuration of a memory cell corresponding to 1 bit data.

Referring to FIG. 9, memory cell MC includes P-channel MOS transistors (access transistors) Mp21 to Mp22 and memory cell capacitors C21 to C22.

Memory cell capacitors C21 to C22 have a common electrode (memory cell plate) connected to a Vcp voltage supply line and the other electrodes connected respectively to the sources of P-channel MOS transistors Mp21 to Mp22. P-channel MOS transistors Mp21 to Mp22 have gates to which word line WL is commonly connected and the drains connected via bit line BL and bit line ZBL to terminals T21 to T22 of sense amplifier portion 32. Terminals T23 to T24 of sense amplifier portion 32 are connected via global IO lines GIO and ZGIO to data path 34. Storage node SN is a node between memory cell capacitor C21 and the source of P-channel MOS transistor Mp21, and storage node ZSN is a node between memory cell capacitor C22 and the source of P-channel MOS transistor Mp22.

In memory cell capacitors C21 to C22, electric charges according to the logic level of data are stored. In memory cell capacitors C21 o C22, usually complementary data is stored. Namely H level data is stored in one of the capacitors and L level data is stores in the other capacitor.

As described above, word line WL is driven to select state so that the complementary data stored in memory cell capacitors C21 to C22 are transmitted to bit lines BL and ZBL. Then, when voltage difference ΔBL between bit lines BL and ZBL becomes a sufficient difference, sense amplifier portion 32 is activated. By the voltage difference detection and amplify operation of sense amplifier 32, one of bit lines BL and ZBL is driven to power supply voltage VddT and the other is driven to ground voltage GND level.

Referring again to FIGS. 7 and 8, when data reading from and data writing to the select memory cell are completed, in WL drive circuit WLD0 associated with select word line WL0, reset signal ZXRST and word line select signal RXT that are driven to GND level cause P-channel MOS transistor Mp11 to be ON and N-channel MOS transistor M11 to be OFF. Then, select word line WL0 becomes non-select state, namely the voltage level of select word line WL0 increases form negative voltage Vneg level to boosted voltage Vpp level.

Then, a bit line precharge circuit (not shown) is activated and bit lines BL and ZBL associated with the select memory cell are driven to the level of intermediate voltage Vbl from intermediate voltage generation circuit 15.

Figure 10:
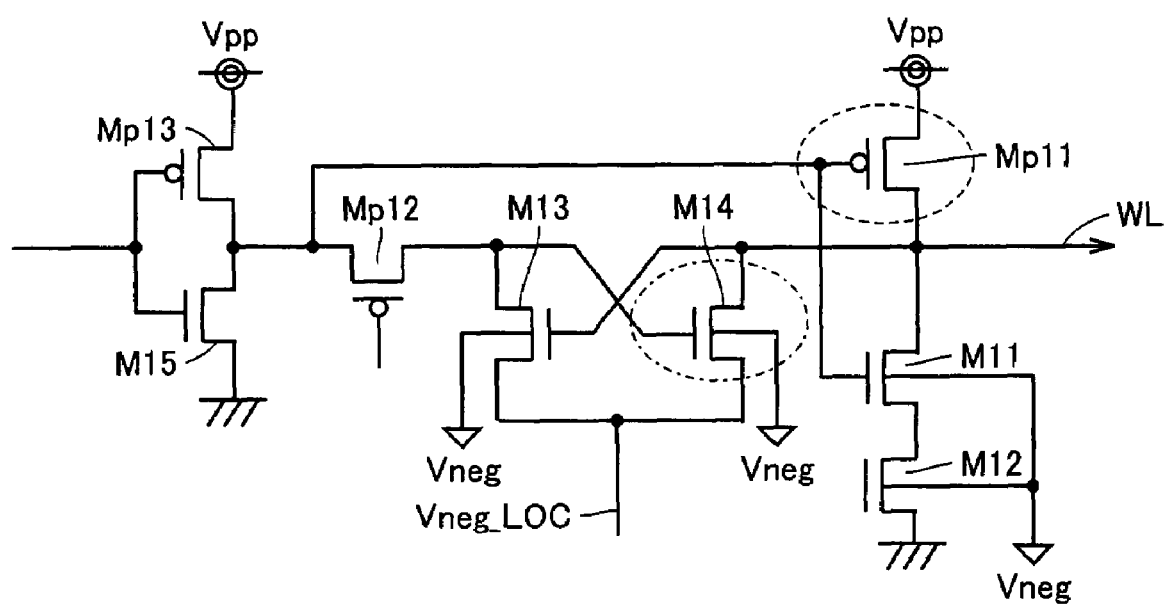
FIG. 10 shows a part of sub row decoder SLD shown in FIG. 7.

FIG. 10 shows a part of sub row decoder SLD shown in FIG. 7. FIG. 11 shows voltages of the transistor enclosed by the circle drawn by the dotted line in FIG. 10, in normal operation and in burn-in test. FIG. 12 shows voltages of the transistor enclosed by the circle drawn by the long and short dashed line in FIG. 10, in normal operation and in burn-in test operation. First, a description is given of the case where the voltage supply operation similar to that in normal operation is performed in the burn-in test.

In the following description, it is supposed, for the semiconductor device of the first embodiment of the present invention, external power supply voltage VddT is 1.2 V, boosted voltage Vpp is 1.6 V, negative voltage Vneg is −0.6 V, reference voltage Vref0 is 0.6 V, reference voltage VreEP is 0.8 V, reference voltage VrefN is 0.3 V, reference voltage VrefB is 0.6 V, and reference voltage VrefC is 0.75 V in normal operation.

Referring to FIGS. 10 and 11, in the case where a select word line is driven to negative voltage Vneg of −0.6 V in normal operation, P-channel MOS transistor Mp11 has the gate supplied with boosted voltage Vpp of 1.6 V and the drain supplied with negative voltage Vneg of −0.6 V. Therefore, between the gate and drain of P-channel MOS transistor Mp11, a high voltage of Vgd=Vpp+|Vneg|=1.6 V+0.6 V=2.2 V is applied. Further, between the drain and source of P-channel MOS transistor Mp11, a high voltage of Vds=Vpp+|Vneg|=1.6 V+0.6 V=2.2 V is applied.

In burn-in test, a voltage value higher than external power supply voltage VddT in normal operation, for example, external power supply voltage VddT# (VddT#>VddT) of 1.9 V is supplied from the outside of the semiconductor device. Then, as the normal operation, internal, power supply generation circuit PG generates internal voltage that is higher by 0.4 V than external power supply voltage VddT. Therefore, boosted voltage Vpp in burn-in test is 1.9 V+0.4 V=2.3 V. Thus, a considerably high voltage of Vpp#+|Vneg|=2.3 V+0.6 V=2.9 V is applied between the gate and drain and between the drain and source of P-channel MOS transistor Mp11, resulting in breakage of the gate insulating film of the thin film transistor.

Referring to FIGS. 10 and 12, in the case where select word line is driven to negative voltage Vneg of −0.6 V in normal operation, boosted voltage Vpp of 1.6 V is supplied to the gate of N-channel MOS transistor M14, and high voltage Vgd is applied between the gate and drain of N-channel MOS transistor M14. Namely, Vgd=Vpp+|Vneg|=1.6 V+0.6 V=2.2 V is applied. Further, between the gate and source of N-channel MOS transistor M14, high voltage Vgs is applied. Namely Vgs=Vpp+|Vneg|=1.6 V+0.6 V=2.2 V is applied.

In burn-in test, boosted voltage Vpp# is 1.9 V+0.4 V=2.3 V. Therefore, a considerably high voltage: Vpp#+|Vneg|=2.3 V+0.6 V=2.9 V is applied between the gate and drain and between the gate and source of N-channel MOS transistor M14, resulting in a problem that the gate insulating film of the thin film transistor is damaged.

Accordingly, for the semiconductor device of the first embodiment of the present invention, burn-in test is conducted using, instead of boosted voltage Vpp#, external power supply voltage VddT# to be supplied to the memory macro so as to alleviate high electric field stress of the transistor to which boosted voltage Vpp and negative voltage Vneg are applied. In the following, the configuration and operation are described with which the semiconductor device of the first embodiment of the present invention undergoes burn-in test.

Figure 13:
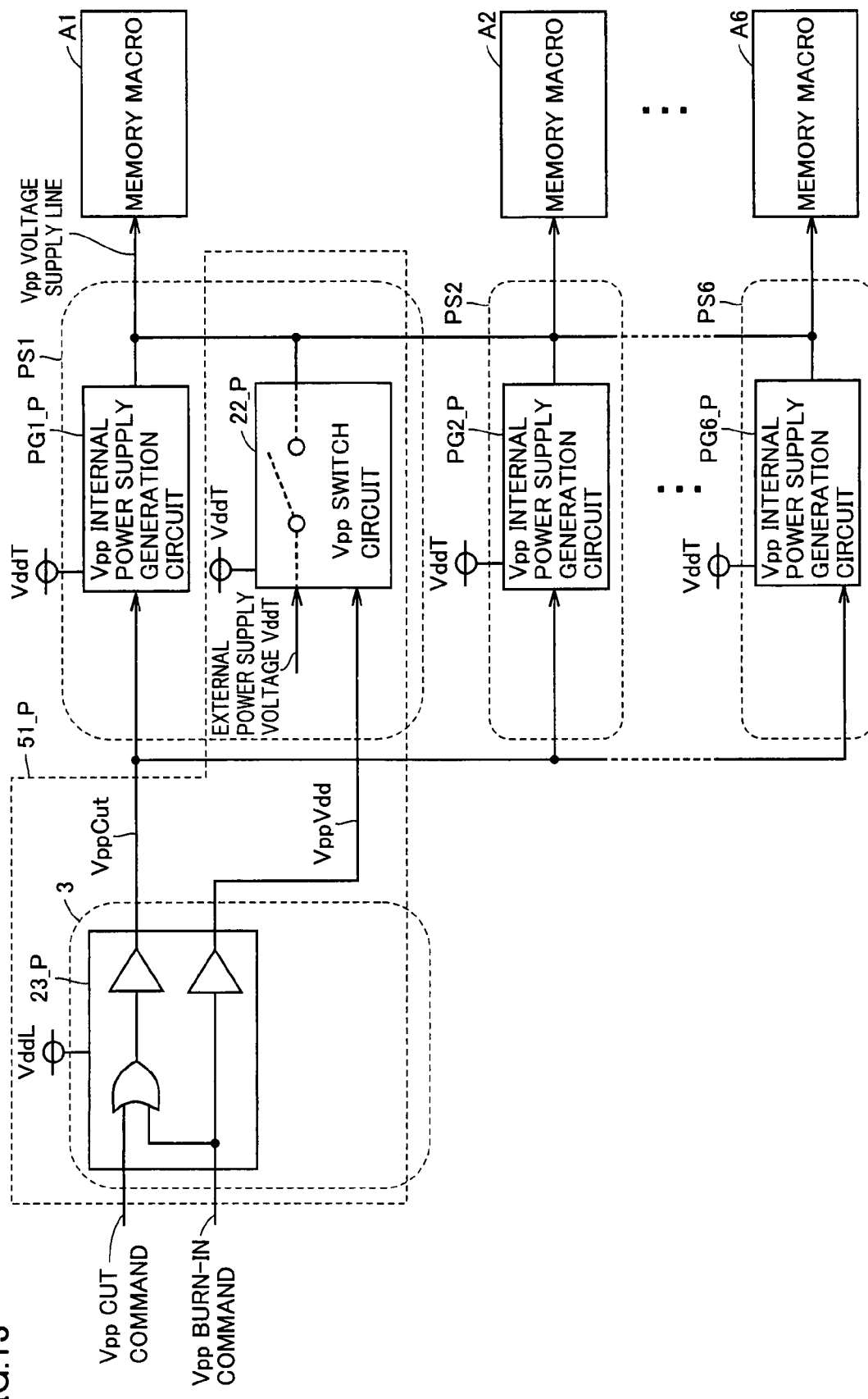
FIG. 13 shows a configuration of a Vpp burn-in circuit and its peripheral circuits according to the first embodiment of the present invention.

FIG. 13 shows a configuration of a Vpp burn-in circuit and its peripheral circuits according to the first embodiment of the present invention.

Referring to FIG. 13, Vpp burn-in circuit 51_P includes a Vpp switch control circuit 23_P and a Vpp switch circuit 22_P. Power supply circuit portions PS1 to PS6 include Vpp internal power supply generation circuits PG1_P to PG6_P.

In normal operation, namely when the Vpp burn-in command has L level, Vpp switch control circuit 23_P outputs burn-in signal VppVdd of L level. In burn-in test, namely the Vpp burn-in command has H level, Vpp switch control circuit 23_P outputs burn-in signal VppVdd of H level and cut signal VppCut of H level. When the Vpp burn-in command has H level or the Vpp cut command has H level, Vpp switch control circuit 23_P outputs cut signal VppCut of H level. In other cases, Vpp switch control circuit 23_P outputs cut signal VppCut of L level in those cases except for the above-described one.

Figure 14:
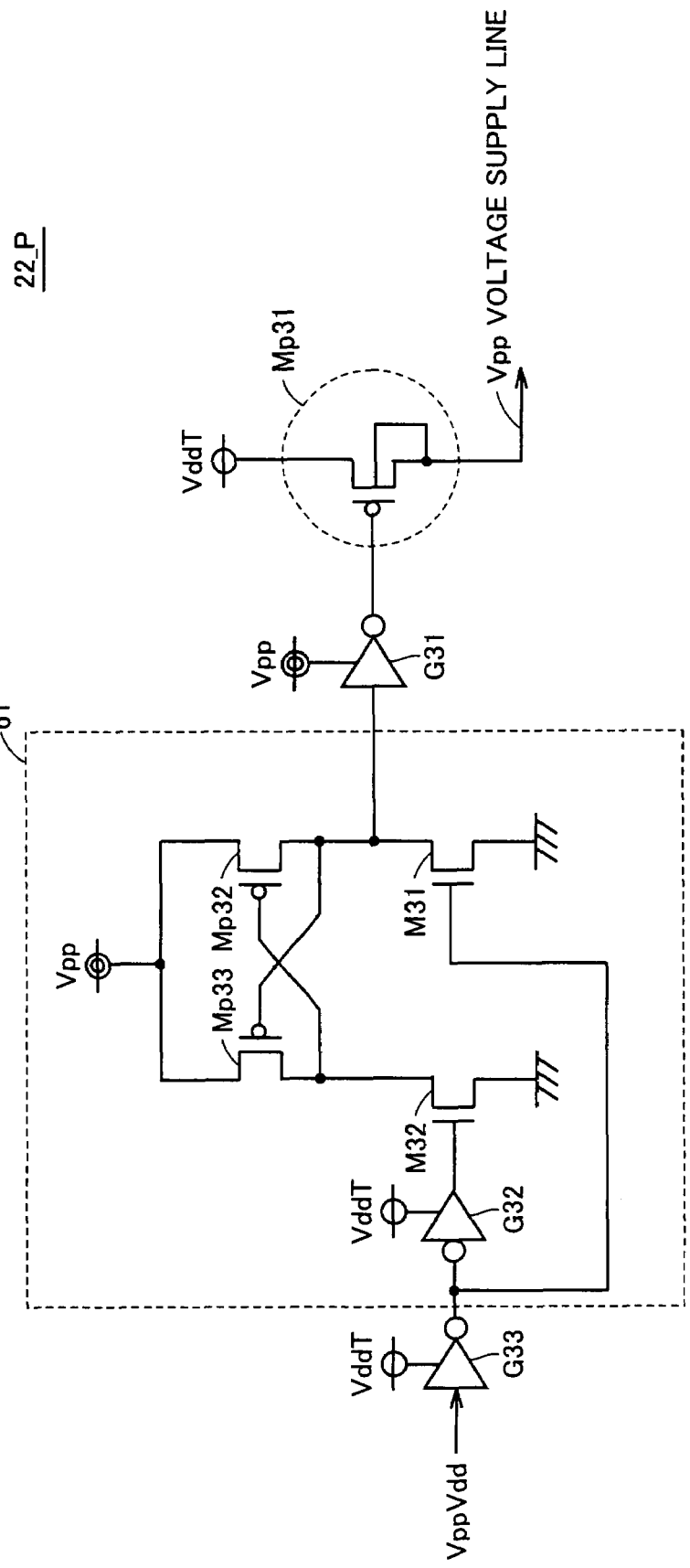
FIG. 14 is a circuit diagram showing a configuration of a Vpp switch circuit according to the first embodiment of the present invention.

FIG. 14 is a circuit diagram showing a configuration of the Vpp switch circuit according to the first embodiment of the present invention.

Referring to FIG. 14, Vpp switch circuit 22_P includes a level conversion circuit 61, a P-channel MOS transistor (switch transistor) Mp31 and inverters G31 and G33, and is configured with logic thin-film transistors. Level conversion circuit 61 includes P-channel MOS transistors Mp32 to 33, N-channel MOS transistors M31 to M32 and an inverter G32. The power supply level of inverter G31 is boosted voltage Vpp and the power supply level of inverters G32 to G33 is external power supply voltage VddT.

Inverter G33 inverts the logic level of burn-in signal VppVdd received from Vpp switch control circuit 23_P and outputs the resultant signal to the gate of N-channel MOS transistor M31 and inverter G32. Inverter G32 inverts the logic level of the signal received from inverter G33 and outputs the resultant signal to the gate of N-channel MOS transistor M32. The drain of N-channel MOS transistor M32, the drain of P-channel MOS transistor Mp33 and the gate of P-channel MOS transistor Mp32 are connected. The gate of P-channel MOS transistor Mp33, the drain of P-channel MOS transistor Mp32, the drain of N-channel MOS transistor M31 and the input of inverter G31 are connected. The output of inverter G31 is connected to the gate of switch transistor Mp31. The drain and well of switch transistor Mp31 are connected to a Vpp voltage supply line. The sources of P-channel MOS transistors Mp32 to Mp33 are connected to boosted voltage Vpp. The source of switch transistor Mp31 is connected to external power supply voltage VddT. The sources of N-channel MOS transistors M31 to M32 are connected to ground voltage GND.

Normal operation is described first. In normal operation, burn-in signal VppVdd is set to GND level. Therefore, the output of inverter G31 has VddT level and P-channel MOS transistor Mp31 is OFF. Here, the backgate of P-channel MOS transistor Mp31 is connected to Vpp. Then, since there is the relation Vpp>VddT, the VddT voltage supply line and Vpp voltage supply line are electrically separated from each other.

In burn-in test, burn-in signal VppVdd is set to L level (H level). Therefore, the output of inverter G31 has GND level and P-channel MOS transistor Mp31 is ON. Accordingly, to the Vpp voltage supply line, external power supply voltage VddT is supplied.

Referring again to FIGS. 10 and 11, for the semiconductor device of the first embodiment of the present invention, in burn-in test, instead of boosted voltage Vpp#, external power supply voltage VddT# smaller in voltage value than boosted voltage Vpp# is supplied to the Vpp voltage supply line. Thus, the voltage of VddT#+|Vneg|=1.9 V+0.6 V=2.5 V is applied between the gate and drain and between the drain and source of P-channel MOS transistor Mp11. Therefore, as compared with the case where the voltage supply operation similar to that of normal operation is also performed in burn-in test, high electric field stress on P-channel MOS transistor Mp11 can be alleviated.

Referring to FIGS. 10 and 12, for the semiconductor device of the first embodiment of the present invention, in burn-in test, the voltage of VddT#+|Vneg|=1.9 V+0.6 V=2.5 V is applied between the gate and drain and between the gate and source of N-channel MOS transistor M14. Thus, as compared with the case where the voltage supply operation similar to that of normal operation is also performed in burn-in test, high electric field stress on N-channel MOS transistor M14 can be alleviated.

Here, level conversion circuit 61 converts burn-in signal VppVdd having the level of external power supply voltage VddL for the logic circuit portion into a signal having the level of boosted voltage Vpp to provide, as boosted voltage Vpp, the voltage corresponding to H level supplied to the gate of P-channel MOS transistor Mp31. With this configuration, even there is the relation VddT<Vpp of the normal operation, the leakage current can be prevented from flowing through P-channel MOS transistor Mp31.

Further, Vpp switch circuit 22_P has the logic circuit configuration that allows burn-in signal VppVdd in normal operation to have L level. With this configuration, even in the case where the power supply level of burn-in signal VppVdd (such as VddL) and the power supply level of switch circuit 22_P (such as VddT) differ from each other (VddL<VddT), leakage current can be prevented from flowing through inverter G33.

Figure 15:
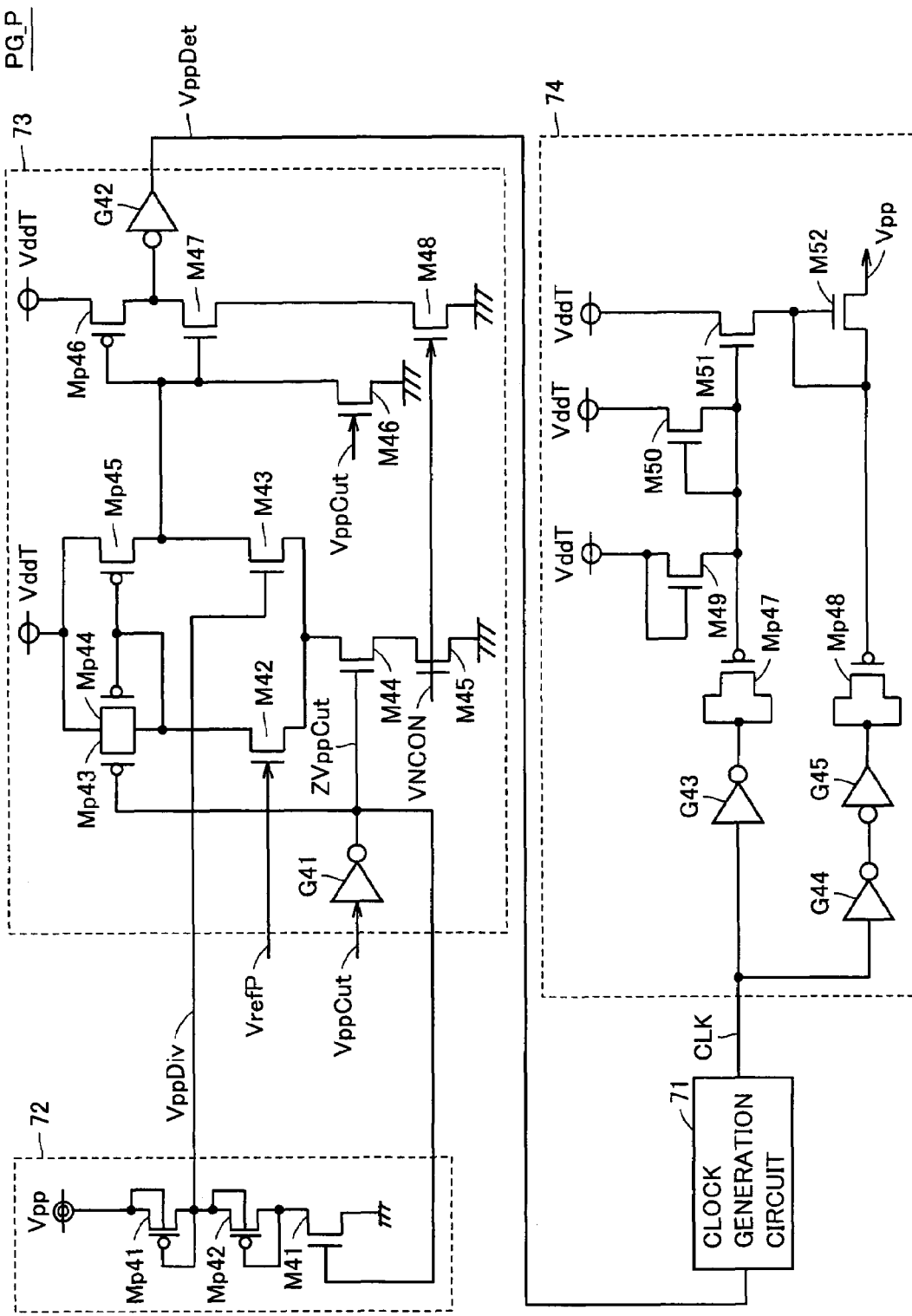
FIG. 15 shows in detail a configuration of a Vpp internal power supply generation circuit according to the first embodiment of the present invention.

FIG. 15 shows in detail a configuration of the Vpp internal power supply generation circuit according to the first embodiment of the present invention.

Referring to FIG. 15, Vpp internal power supply generation circuit PG_P includes a clock generation circuit 71, a voltage divider circuit 72, a detector circuit 73 and a pump circuit 74. Voltage divider circuit 72 includes P-channel MOS transistors Mp41 to Mp42 and an N-channel MOS transistor M41. Detector circuit 73 includes P-channel MOS transistors Mp43 to Mp46, N-channel MOS transistors M42 to M48 and inverters G41 to G42. Pump circuit 74 includes P-channel MOS transistors Mp47 to Mp48, N-channel MOS transistors M49 to M52 and inverters G43 to G45.

Vpp cut signal VppCut from Vpp switch control circuit 23_P is supplied to the gate of N-channel MOS transistor M46. Reference voltage VrefP from reference voltage buffer circuit 14 is supplied to the gate of N-channel MOS transistor M42. Constant current VNCON from constant current generation circuit IG is supplied to the gates of N-channel MOS transistors M45 and M48.

Inverter G41 outputs Vpp cut signal ZVppCut which has the logic level generated by inverting the logic level of Vpp cut signal VppCut received from Vpp switch control circuit 23_P, to the gate of P-channel MOS transistor Mp43 and the gates of N-channel MOS transistors M41 and M44.

The gate and drain of P-channel MOS transistor Mp41, the source and well of P-channel MOS transistor Mp42 and the gate of N-channel MOS transistor M43 are connected. The gate and drain of P-channel MOS transistor Mp42 and the drain of N-channel MOS transistor M41 are connected. The drain of P-channel MOS transistor Mp43, the drain and gate of P-channel MOS transistor Mp44, the gate of P-channel MOS transistor Mp45 and the drain of N-channel MOS transistor M42 are connected. The source of N-channel MOS transistor M42, the source of N-channel MOS transistor M43 and the drain of N-channel MOS transistor M44 are connected. The drain of N-channel MOS transistor M43, the drain of P-channel MOS transistor Mp45, the gate of P-channel MOS transistor Mp46, the drain of N-channel MOS transistor M46 and the gate of N-channel MOS transistor M47 are connected. The source of N-channel MOS transistor M44 and the drain of N-channel MOS transistor M45 are connected. The source of N-channel MOS transistor M47 and the drain of N-channel MOS transistor M48 are connected. The drain of P-channel MOS transistor Mp46, the drain of N-channel MOS transistor M47 and the input of inverter G42 are connected. The output of inverter G42 is supplied as VppDet signal to clock generation circuit 71.

Clock generation circuit 71 outputs clock CLK when VppDet signal has H level, and stops outputting clock CLK when this signal has L level. Inverters G43 to G44 invert the logic level of clock CLK received from clock generation circuit 71 and output the resultant clock. Inverter G45 inverts the output of inverter G44 and outputs the resultant output to the drain and source of P-channel MOS transistor Mp48.

The output of inverter G43 and the drain and source of P-channel MOS transistor Mp47 are connected. The output of inverter G45 and the drain and source of P-channel MOS transistor Mp48 are connected. The gate of P-channel MOS transistor Mp47, the source of N-channel MOS transistor M49, the source of N-channel MOS transistor M50 and the gate of N-channel MOS transistor M51 are connected. The source of N-channel MOS transistor M51, the gate and drain of N-channel MOS transistor M52 and the gate of P-channel MOS transistor Mp48 are connected. The source of N-channel MOS transistor M52 is connected to the Vpp voltage supply line.

The source and well of P-channel MOS transistor Mp41 are connected to boosted voltage Vpp. The sources of P-channel MOS transistors Mp43 to Mp46, the drain and gate of N-channel MOS transistor M49 and the drains of N-channel MOS transistors M50 to M51 are connected to external power supply voltage VddT. The sources of N-channel MOS transistors M41, M45, M46, M48 are connected to the ground voltage.

In the case where Vpp cut signal VppCut has H level, the gate of N-channel MOS transistor 46 is supplied with a signal of H level. Therefore, boosted voltage detection signal VppDet that is output from detector circuit 73 is forced to have L level. Then, clock generation circuit 71 stops outputting clock CLK and pump circuit 74 stops the pumping operation. With this configuration, in burn-in test, it can be prevented that the output of Vpp internal power supply generation circuit PG_P and external power supply voltage VddT from Vpp switch circuit 22_P are simultaneously output to the Vpp voltage supply line.

The semiconductor devices disclosed in Patent Documents 1 and 2 have problems that high electric field stress cannot be applied to the devices for avoiding breakage of the thin film transistor, that long time is required for burn-in test, that stress for revealing early failures cannot be applied to the gate oxide film for example of the transistor, and that early defectives cannot be eliminated sufficiently. In contrast, the semiconductor device according to the first embodiment of the present invention supplies, in burn-in test, external power supply voltage VddT smaller in voltage value than boosted voltage Vpp to the memory macro, instead of supplying boosted voltage Vpp. In other words, the voltage difference between boosted voltage Vpp (positive voltage) and negative voltage Vneg supplied to the memory macro is reduced so as to alleviate stress of high electric field on each transistor of row decoder 33L for example. Therefore, for the semiconductor device of the first embodiment of the present invention, breakage of the gate oxide film for example of the transistor in such defect detection test as burn-in test can be prevented. Further, since external power supply voltage VddT in defect detection test can be set to a high voltage, the test time can be shortened and early defectives can be eliminated sufficiently. In other words, on the semiconductor device of the first embodiment of the present invention, defect detection test can be performed appropriately.

Moreover, since Vpp switch circuit 22_P is configured with thin film transistors for logic applications, the current driving ability per unit area is high as compared with the conventional logic-merged memory circuit configured with thick film transistors, and thus the layout area can be reduced. In addition, since Vpp switch circuit 22_P is driven with the low power supply for logic applications, namely external power supply voltage VddT and boosted voltage Vpp, any arrangement is unnecessary for addressing such problems as latch up and circuit malfunction due to the order of supplying the high power for thick film transistors and the low power for logic applications.

In the semiconductor device of the first embodiment of the present invention, external power supply voltage VddL for logic applications is supplied to logic circuit portion 3, and external power supply voltage VddT for memory is supplied to memory macros A1 to A6 and power supply circuit portions PS1 to PS6. Although external power supply voltage VddL for logic applications and external power supply voltage VddT for memory are identical in voltage value, they are electrically separated. For example, since Vpp switch control circuit 23_P is provided in logic circuit portion 3, external power supply voltage VddL for logic applications is supplied. In contrast, since Vpp switch circuit 22_P is provided in power supply circuit portion PS, external power supply voltage VddT for memory is supplied. With this configuration, it can be prevented that power supply noises of logic circuit portion 3 and memory macros A1 to A6 influence each other to cause malfunction of the logic circuit portion and memory macros.

Here, since the Vpp voltage supply line is a voltage supply line for all word lines WL of the memory array, many transistors are connected to the voltage supply line. Further, in the semiconductor device of the first embodiment of the present invention, thin film transistors are used. Therefore, according to evaluation of the actual device, when any variations in the manufacturing process cause the threshold value of the transistor to have a value lower than a predetermined range, a few tens of mA of off-leakage current between boosted voltage Vpp and ground voltage GND in row decoder 33L flows per chip, as compared with a few hundreds of µA per chip in a normal case.

In particular, in burn-in test which is a test operating the semiconductor device at high voltage, high temperature and low frequency, off-leakage current Ipps could be larger than operating current Ipp of the semiconductor device. Therefore, in order to avoid shortage of supply current in burn-in test, the size (the ratio between the channel length L and the channel width W namely W/L) of the switch transistor of Vpp switch circuit 22_P preferably has a value that can be appropriate for off-leakage current Ipps.

According to the first embodiment of the present invention, the semiconductor device is configured to supply to the memory macro external power supply voltage VddT instead of boosted voltage Vpp in burn-in test. However, the present invention is not limited to this. As long as a positive voltage having the absolute value smaller than that of boosted voltage Vpp is supplied to the memory macro in burn-in test, the voltage difference between boosted voltage Vpp and negative voltage Vneg supplied to the memory macro can be reduced.

Further, in burn-in test, the voltage supplied to the memory macro instead of boosted voltage Vpp is external power supply voltage VddT supplied to the semiconductor device from the outside. Therefore, it is unnecessary to separately provide a circuit generating a positive voltage smaller in absolute value than boosted voltage Vpp. Thus, the configuration of the semiconductor device can be simplified.

According to the first embodiment of the present invention, the semiconductor device is configured to provide a smaller voltage difference between boosted voltage Vpp (positive voltage) and negative voltage Vneg supplied to the memory macro in burn-in test. The present invention, however, is not limited to this configuration. As long as two voltages applied to a particular transistor or the like of the memory macro have a smaller voltage difference, the two voltages are not limited to boosted voltage Vpp (positive voltage) and negative voltage Vneg. Both of the two voltages may be positive or negative. It should be noted, however, if the memory cell is configured with P-channel MOS transistors, both of the positive voltage and negative voltage are used for the semiconductor device in many cases, which means that the voltage difference between the two voltages applied to the transistor for example is large in many cases. Therefore, in this case, the configuration providing a smaller voltage difference between boosted voltage Vpp (positive voltage) and negative voltage Vneg supplied to the memory macro is particularly advantageous.

In the following, another embodiment of the present invention is described in connection with the drawings. In the drawings, like or corresponding components are denoted by like reference characters and the description thereof is not repeated.

Second Embodiment

The present embodiment relates to a semiconductor device in which the voltage supplied to the negative voltage supply line in burn-in test is changed, as compared with the semiconductor device of the first embodiment. The configuration and operation of the semiconductor device, except for the features described below, are similar to those of the semiconductor device of the first embodiment.

Figure 16:
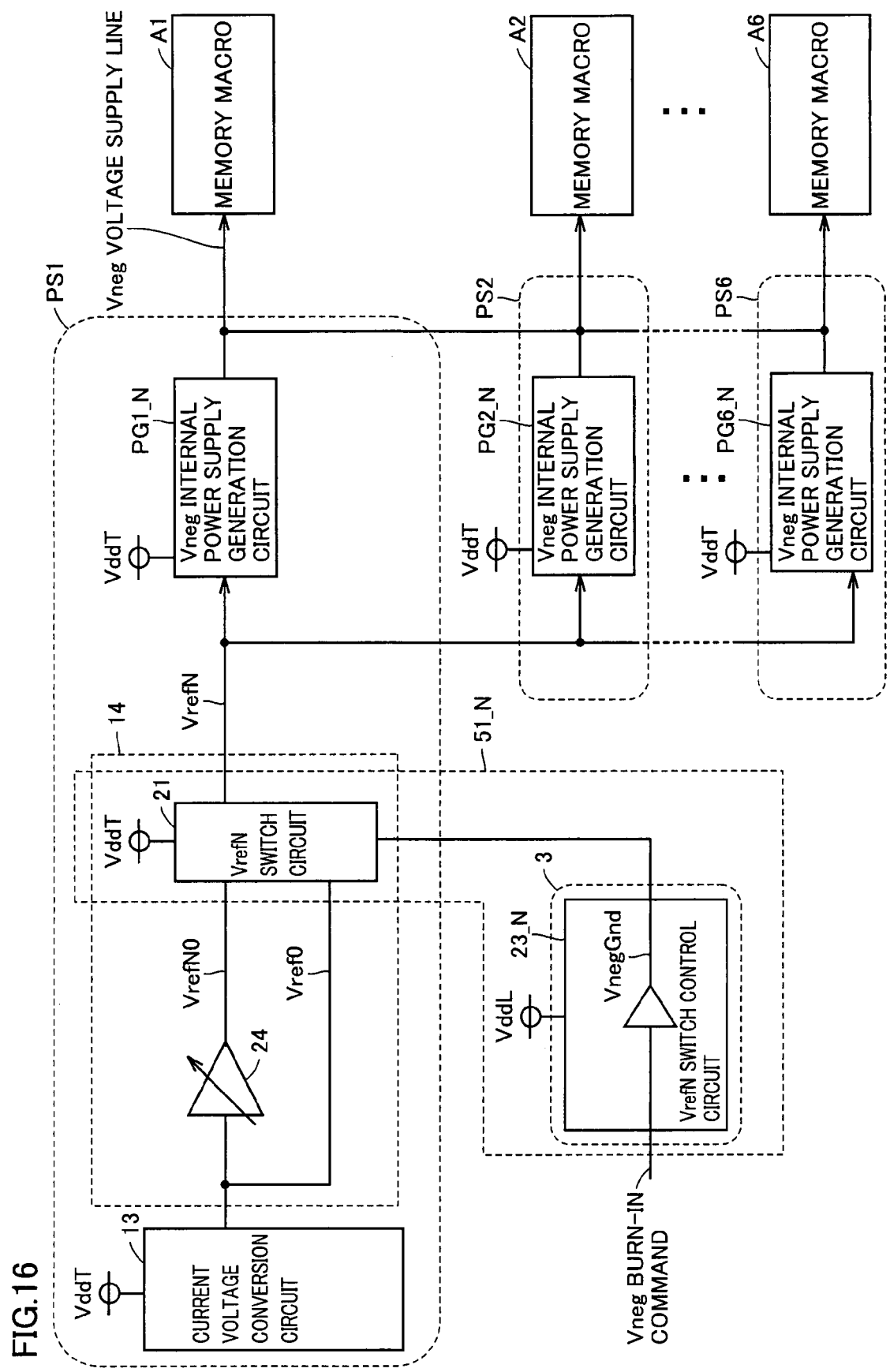
FIG. 16 shows a configuration of a Vneg burn-in circuit and its peripheral circuits according to a second embodiment of the present invention.

FIG. 16 shows a configuration of a Vneg burn-in circuit and its peripheral circuits according to the second embodiment of the present invention.

Referring to FIG. 16, Vneg burn-in circuit 51_N includes a VrefN switch circuit 21 and a VrefN switch control circuit 23_N. VrefN switch control circuit 23_N is provided within logic circuit portion 3. Power supply circuit portions PS1 to PS6 include Vneg internal power supply generation circuits PG1_N to PG6_N, and only power supply circuit portion PS1 includes a reference voltage buffer circuit 14. Reference voltage buffer circuit 14 includes VrefN switch circuit 21 and a VrefN buffer circuit 24.

Figure 17:
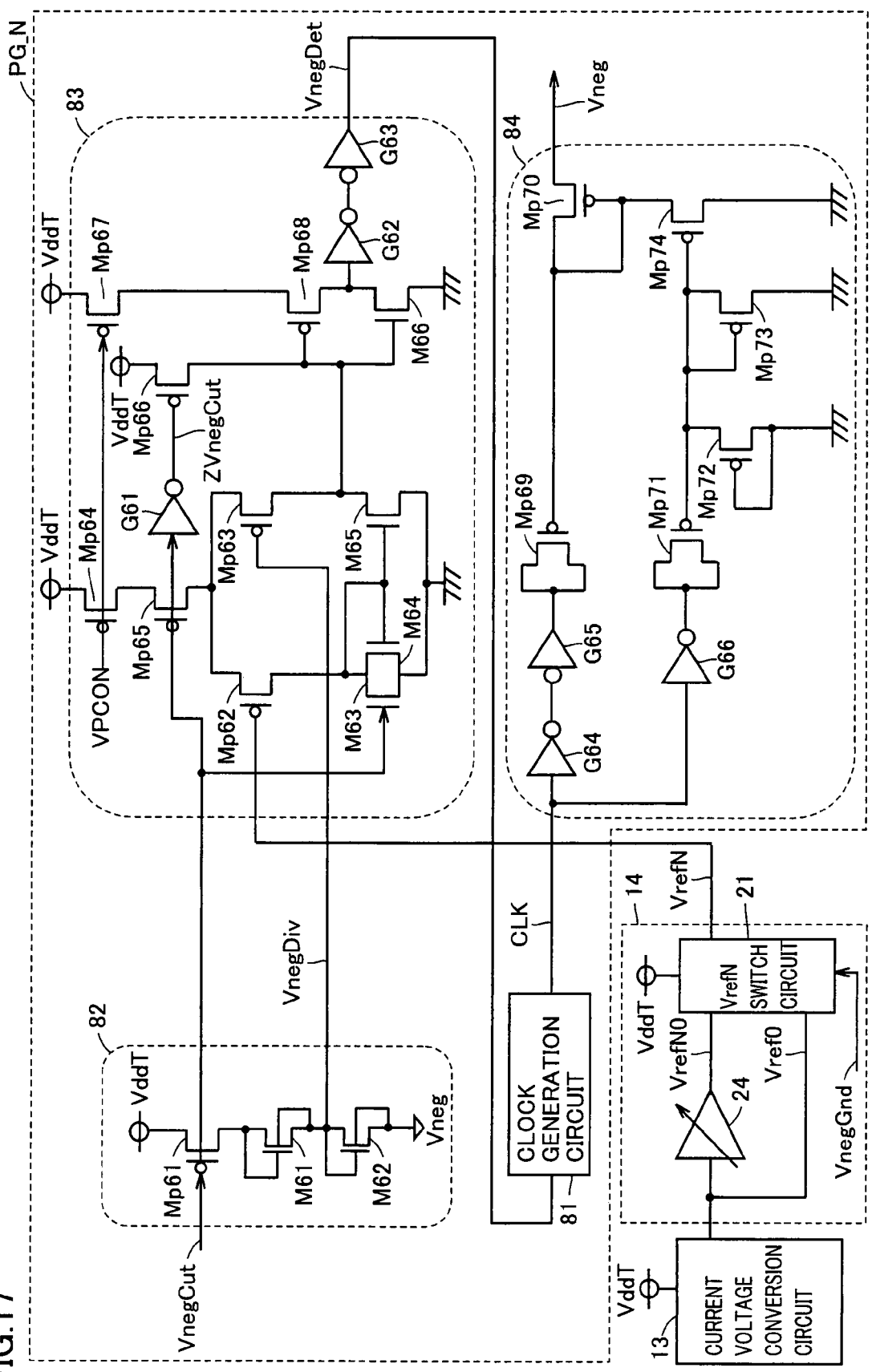
FIG. 17 shows a configuration of a Vneg internal power supply generation circuit and its peripheral circuits according to the second embodiment of the present invention.

FIG. 17 shows a configuration of a Vneg internal power supply generation circuit and its peripheral circuits according to the second embodiment of the present invention.

Referring to FIG. 17, Vneg internal power supply generation circuit PG_N includes a clock generation circuit 81, a voltage divider circuit 82, a detector circuit 83 and a pump circuit 84. Voltage divider circuit 82 includes a P-channel MOS transistor Mp61 and N-channel MOS transistors M61 to M62. Detector circuit 83 includes P-channel MOS transistors Mp62 to Mp68, N-channel MOS transistors M63 to M66 and inverters G61 to G63. Pump circuit 84 includes P-channel MOS transistors Mp69 to Mp74 and inverters G64 to G66.

Cut signal VnegCut from switch control circuit 23 is input to the gates of P-channel MOS transistors Mp61 and Mp65, the gate of N-channel MOS transistor Mp63 and inverter G61. Reference voltage VrefN from reference voltage buffer circuit 14 is supplied to the gate of P-channel MOS transistor Mp62. Constant current VPCON from constant current generation circuit IG is supplied to the gates of P-channel MOS transistors Mp64 and Mp67.

Inverter G61 receives cut signal VnegCut from switch control circuit 23, inverts the logic level of the cut signal and outputs resultant cut signal ZVnegCut to the gate of P-channel MOS transistor Mp66.

The gate and drain of N-channel MOS transistor M61 and the drain of P-channel MOS transistor Mp61 are connected. The source and well of N-channel MOS transistor M61, the drain and gate of N-channel MOS transistor M62 and the gate of P-channel MOS transistor Mp63 are connected. The sources of P-channel MOS transistors Mp62 and Mp63 and the drain of P-channel MOS transistor Mp65 are connected. The drain of P-channel MOS transistor Mp62, the drain of N-channel MOS transistor M63, the drain and gate of N-channel MOS transistor M64 and the gate of N-channel MOS transistor M65 are connected. The drain of N-channel MOS transistor M65, the drain of N-channel MOS transistor M63, the gate of N-channel MOS transistor M66, the gate of P-channel MOS transistor Mp68 and the drain of P-channel MOS transistor Mp66 are connected. The source of P-channel MOS transistor Mp65 and the drain of P-channel MOS transistor Mp64 are connected. The drain of p channel MOS transistor Mp67 and the source of P-channel MOS transistor Mp68 are connected. The drain of P-channel MOS transistor Mp68, the drain of N-channel MOS transistor M66 and the input of inverter G62 are connected. The output of inverter G62 and the input of inverter G63 are connected. The output of inverter G63 is supplied as VnegDet signal to clock generation circuit 81.

Clock generation circuit 81 outputs clock CLK in the case where VnegDet signal has H level, and stops outputting clock CLK in the case where the signal has L level. Inverters G64 and G66 invert the logic level of clock CLK received from clock generation circuit 81 and output the resultant signal. Inverter G65 inverts the output of inverter G64 and outputs the resultant signal to the drain and source of P-channel MOS transistor 69.

The output of inverter G66 and the drain and source of P-channel MOS transistor Mp71 are connected. The gate of P-channel MOS transistor Mp71, the source of P-channel MOS transistor Mp72, the gate and source of P-channel MOS transistor Mp73 and the gate of P-channel MOS transistor Mp74 are connected.

The gate of P-channel MOS transistor Mp69, the gate and source of P-channel MOS transistor Mp70 and the source of P-channel MOS transistor Mp74 are connected. The drain of P-channel MOS transistor Mp70 is connected to the Vneg voltage supply line.

The source and well of N-channel MOS transistor M62 are connected to negative voltage Vneg. The sources of P-channel MOS transistors Mp61, Mp64, Mp66, Mp67 are connected to external power supply voltage VddT. The sources of N-channel MOS transistors M63 to M66, the gate and drain of P-channel MOS transistor Mp72 and the drains of P-channel MOS transistors Mp73 and Mp74 are connected to the ground voltage.

Current voltage conversion circuit 13 generates reference voltage Vref0 having the potential ½×VddT for example and outputs the voltage to VrefN buffer circuit 24 and VrefN switch circuit 21.

VrefN buffer circuit 24 of reference voltage buffer circuit 14 performs voltage conversion on Vref0 received from current voltage conversion circuit 13, amplifies the converted voltage and outputs the voltage as reference voltage VrefN0. VrefN buffer circuit 24 is configured with a current mirror circuit and can change the mirror ratio of the current mirror circuit to change the voltage value of reference voltage VrefN0.

Voltage divider circuit 82 outputs, from the connection point of N-channel MOS transistors M61 and M62, negative voltage division voltage VnegDiv that is an intermediate voltage between, for example, external power supply voltage VddT and negative voltage Vneg supplied from pump circuit 84.

VrefN switch circuit 21 outputs, in normal operation, reference voltage VrefN0 received from VrefN buffer circuit 24, as reference voltage VrefN. In burn-in test, VrefN switch circuit 21 outputs reference voltage Vref0 received from current voltage conversion circuit 13 as reference voltage VrefN.

Detector circuit 83 compares reference voltage VrefN with negative voltage division voltage VnegDiv and, based on the result of the comparison, converts negative voltage detection signal VnegDet to H level or L level to output the resultant voltage to clock generation circuit 81.

Clock generation circuit 81 is a commonly used ring oscillator, generates clock signal CLK in the case where negative voltage detection signal VnegDet supplied from detector circuit 83 has H level and stops generating clock CLK in the case where the signal has L level.

Pump circuit 84 performs pumping operation according to clock CLK supplied from clock generation circuit 81 to generate negative voltage Vneg.

Figure 18:
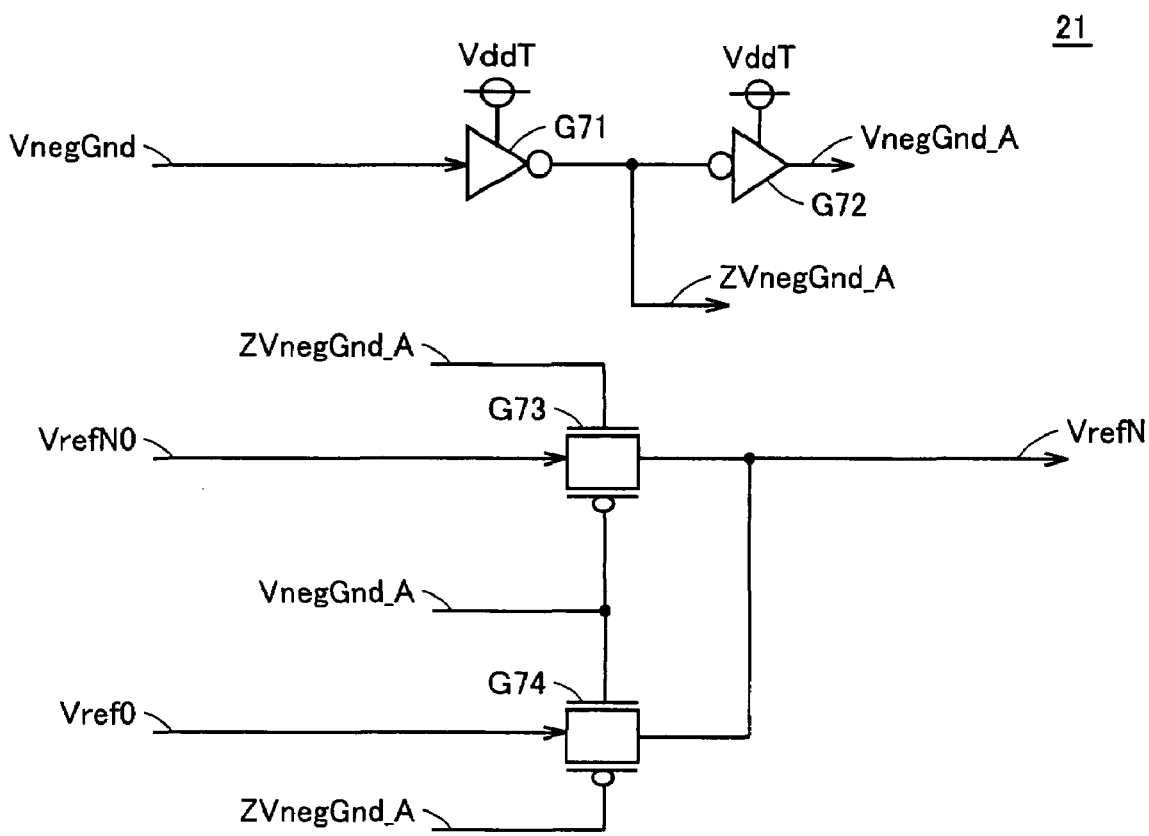
FIG. 18 is a circuit diagram showing a configuration of a VrefN switch circuit according to the second embodiment of the present invention.

FIG. 18 is a circuit diagram showing a configuration of the VrefN switch circuit according to the second embodiment of the present invention.

Referring to FIG. 18, VrefN switch circuit 21 includes transfer gates G73 to G74 and inverters G71 to G72 and is configured with thin film transistors for logic applications.

First, Normal operation is described. In normal operation, the Vneg burn-in command having L level is input to VrefN switch circuit 21, and burn-in signal VnegGnd is set to GND level (L level). Therefore, transfer gate G74 is OFF and transfer gate G73 is ON. Accordingly, reference voltage VrefN0 is output as reference voltage Vref.

Second, burn-in test is described. In burn-in test, the Vneg burn-in command having H level is input to VrefN switch circuit 21, and burn-in signal VnegGnd is set to VddL level (H level). Therefore, transfer gate G73 is OFF and transfer gate G74 is ON. Accordingly, reference voltage Vref0 is output as reference voltage Vref.

Next, the relation between reference voltage VrefN, negative voltage Vneg and external power supply voltage VddT is described.

Reference voltage Vref0 that is output from current voltage conversion circuit 13 is represented by the following expression:

$$Vref0 = VddT/2 \qquad (1).$$

Negative voltage division voltage VnegDiv that is output from voltage divider circuit 82 is represented by the following expression:

$$VnegDiv = VddT/2 + Vneg/2 \qquad (2).$$

In Vneg internal power supply generation circuit PG_N, detector circuit 83 makes a comparison between reference voltage VrefN and negative voltage division voltage VnegDiv. According to the result of the comparison, negative voltage Vneg that is output from pump circuit 84 changes. Negative voltage Vneg output from pump circuit 84 is input to voltage divider circuit 82. Thus, a feed back circuit of negative voltage Vneg is formed. The following expression is thus valid:

$$VrefN = VnegDiv \qquad (3).$$

From expressions (2) and (3), negative voltage Vneg is represented by the following expression:

$$Vneg = 2 \times VrefN - VddT \qquad (4).$$

In normal operation, VrefN buffer circuit 24 outputs a voltage that is smaller by a predetermined value than reference voltage Vref0 received from current voltage conversion circuit 13 for example. Supposing that the predetermined value is Vdiff, VrefN is represented by the following expression from expression (1):

$$VrefN = VddT/2 - Vdiff \qquad (5).$$

To expression (4), expression (5) is substituted to provide negative voltage Vneg represented by the following expression:

$$Vneg = -2 \times Vdiff \qquad (6).$$

From expression (6), it is seen that the semiconductor device of the second embodiment of the present invention can generate, in normal operation, negative voltage Vneg which is a constant voltage that does not depend on the voltage value of external power supply voltage VddT.

In burn-in test, VrefN buffer circuit 24 outputs, as reference voltage Vref, reference voltage Vref0 received from current voltage conversion circuit 13. Therefore, VrefN is represented by the following expression from expression (1):

$$VrefN = VddT/2 \qquad (7).$$

To expression (4), expression (7) is substituted to represent negative voltage Vneg by the following expression:

$$Vneg = 2 \times VddT/2 - VddT = 0 \qquad (8).$$

It is seen from expression (8) that the semiconductor device of the second embodiment of the present invention can supply ground voltage GND to the Vneg voltage supply line without depending on the voltage value of external power supply voltage VddT in burn-in test.

Here, it is supposed, for the semiconductor device of the second embodiment of the present invention in normal operation, external power supply voltage VddT is 1.2 V, boosted voltage Vpp is 1.6 V, negative voltage Vneg is −0.6 V, negative voltage division voltage VnegDiv is −0.3 V, reference voltage Vref0 is 0.6 V, VrefP is 0.8 V, reference voltage VrefN is 0.3 V, reference voltage VrefB is 0.6 V and reference voltage VrefC is 0.75 V.

In this case, in order to have Vneg=−0.6 V in normal operation, Vdiff=0.3 V may be set as seen from expression (6). Further, in order to have Vneg=0 V in burn-in test, Vref0=0.95 V may be set as seen from expression (1).

FIG. 19 shows voltages of the transistor enclosed by the circle drawn by the dotted line in FIG. 10, in normal operation and in burn-in test. FIG. 20 shows voltages of the transistor enclosed by the circle drawn by the long and short dashed line in FIG. 10 in normal operation and in burn-in test.

Regarding the semiconductor device of the second embodiment of the present invention, in burn-in test, ground voltage GND is supplied, instead of negative voltage Vneg, to the Vneg voltage supply line. Therefore, the voltage of Vpp#+|Vneg|=2.3 V+0 V=2.3 V is applied between the gate and drain and between the drain and source of P-channel MOS transistor Mp11. Thus, as compared with the case where the voltage supply operation similar to that of normal operation is performed in burn-in test, high electric field stress on P-channel MOS transistor Mp11 can be alleviated.

Further, regarding the semiconductor device of the second embodiment of the present invention, in burn-in test, the voltage of Vpp#+|Vneg|=2.3 V+0 V=2.3 V is applied between the gate and drain and between the gate and source of N-channel MOS transistor M14. Thus, as compared with the case where the voltage supply operation similar to that of normal operation is performed in burn-in test, high electric field stress on N-channel MOS transistor M14 can be alleviated.

Accordingly, regarding the semiconductor device according to the second embodiment of the present invention, in burn-in test, ground voltage GND is supplied, instead of supplying negative voltage Vneg, to the memory macro via the Vneg voltage supply line. In other words, the voltage difference between boosted voltage Vpp (positive voltage) and negative voltage Vneg supplied to the memory macro is reduced. Thus, for example, high electric field stress on each transistor of row decoder 33L for example is alleviated. Therefore, for the semiconductor device of the second embodiment of the present invention, as the semiconductor device of the first embodiment, it can be prevented that the gate oxide film for example of the transistor is broken in such defect detection test as burn-in test. Further, since external power supply voltage VddT in defect detection test can be set high, the test time can be shortened and early defectives can be eliminated sufficiently. In other words, on the semiconductor device of the second embodiment of the present invention, defect detection test can be performed appropriately.

VrefN switch circuit 21 has the logic circuit configuration providing L level of burn-in signal VnegGnd in normal operation. With this configuration, even if the power supply level (for example VddL) of burn-in signal VnegGnd and the power supply level (VddT for example) of VrefN switch circuit 21 differ from each other (VddL<VddT), leakage current can be prevented from flowing through inverter G71.

Although the semiconductor device in the second embodiment of the present invention as described above is configured to supply ground voltage GND, instead of negative voltage Vneg, to the Vneg voltage supply line in burn-in test, the present invention is not limited to this. As long as the semiconductor device is configured to supply a negative voltage having a smaller absolute value than that of negative voltage Vneg is supplied in burn-in test, the voltage difference between boosted voltage Vpp and negative voltage Vneg supplied to the memory macro can be decreased. Further, in burn-in test, a negative voltage having a smaller absolute value than that of negative voltage Vneg and a positive voltage having a smaller absolute value than boosted voltage Vpp may be supplied to the memory macro.

Furthermore, in burn-in test, the voltage supplied to the memory macro instead of negative voltage Vpp may be ground voltage GND that is supplied from the outside of the semiconductor device. In that case, it is unnecessary to separately provide a circuit generating a negative voltage having a smaller absolute value than negative voltage Vneg. Then, the configuration of the semiconductor device can be simplified.

In the following, still another embodiment of the present invention is described in connection with the drawings. In the drawings, like or corresponding components are denoted by like reference characters and the description thereof is not repeated.

Third Embodiment

The present embodiment relates to a semiconductor device additionally having the pump-number changing function as compared with the semiconductor device of the second embodiment. The configuration and operation of the semiconductor device, except for the features described below, are similar to those of the semiconductor device of the second embodiment.

Figure 21:
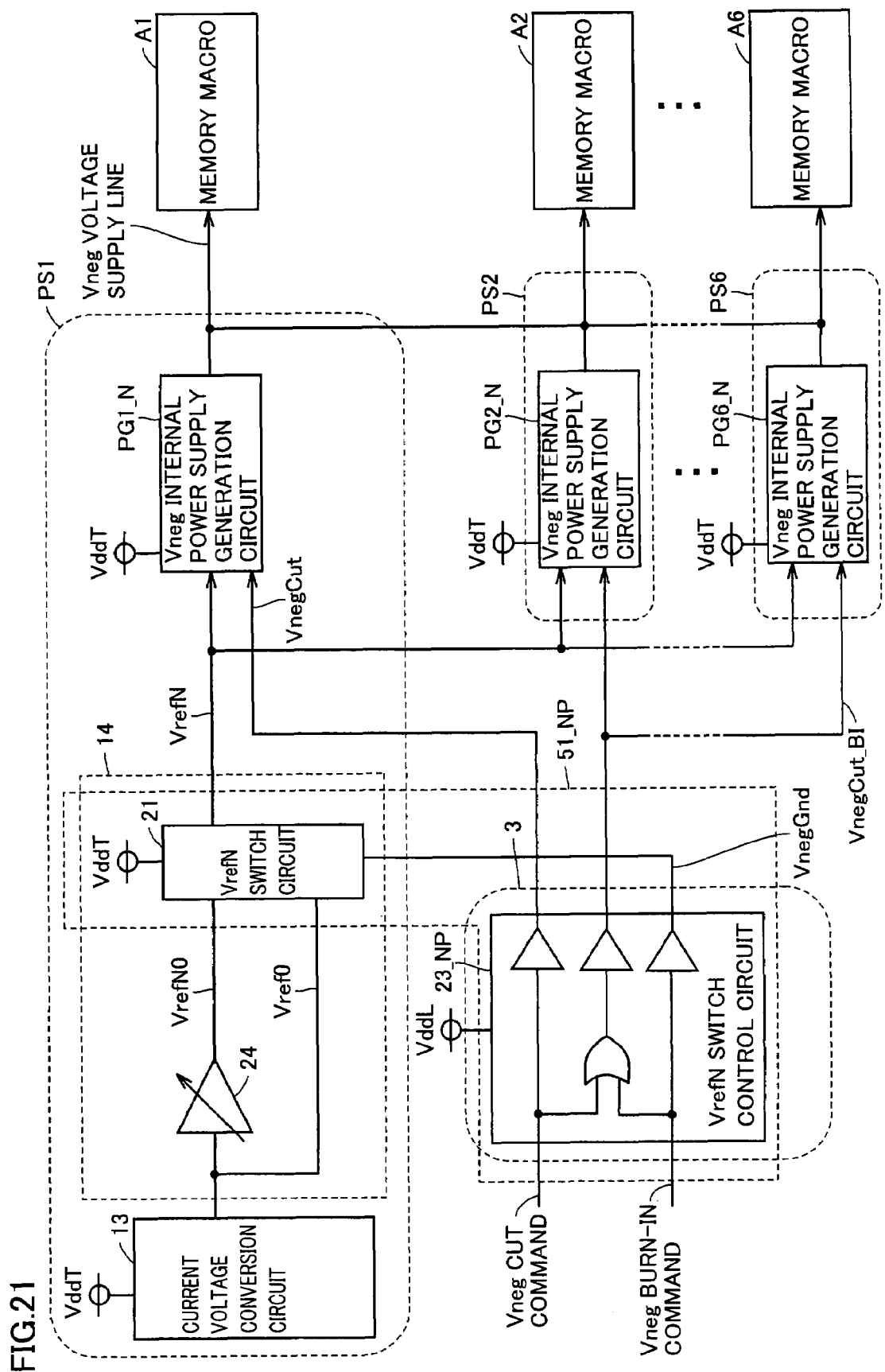
FIG. 21 schematically shows a configuration of a Vneg burn-in circuit having pump-number changing function according to a third embodiment of the present invention.

FIG. 21 schematically shows a configuration of a Vneg burn-in circuit having the pump-number changing function according to the third embodiment of the present invention.

Referring to FIG. 21, Vneg burn-in circuit 51_NP having the pump-number changing function includes a VrefN switch circuit 21 and a VrefN switch control circuit 23_NP.

VrefN switch control circuit 23_NP outputs, based on the Vneg burn-in command and the Vneg cut command, burn-in signal VnegGnd, cut signal VnegCut and cut signal VnegCut_BI.

Vneg voltage supply lines driven respectively by Vneg internal power supply generation circuits PG1_N to PG6_N are commonly connected. Vneg internal power supply generation circuit PG1_N of power supply circuit portion PS1 can supply negative voltage Vneg to memory macros A1 to A6. Further, cut signal VnegCut is output to Vneg internal power supply generation circuit PG1_N and cut signal VnegCut_BI is supplied to Vneg internal power supply generation circuits PG2_N to PG6_N.

Normal operation is described first. In normal operation, the Vneg cut command and Vneg burn-in command are inactive while VnegCut signal and Vneg Cut_BI signal are set to L level. Thus, Vneg internal power supply generation circuits PG1_N to PG6_N supply negative voltage Vneg to memory macros A1 to A6 respectively.

Burn-in test is described next. In burn-in test, the Vneg burn-in command is activated. Here, VnegCut_BI signal is the logical sum of the Vneg cut command and Vneg burn-in command, and thus set to H level. Accordingly, Vneg internal power supply generation circuits PG2_N to PG6_N stop supplying negative voltage Vneg and only Vneg internal power supply generation circuit PG1_N supplies negative voltage Vneg to memory macros A1 to A6.

Here, in burn-in test, external power supply voltage VddT# that has a larger voltage value than external power supply voltage VddT in normal operation is supplied to the memory macro. Therefore, if Vneg internal power supply generation circuits PG1_N to PG6_N driven by external power supply voltage VddT# are operated similarly to normal operation, voltage variation and ripple of negative voltage Vneg increases, stress for revealing early failures cannot be applied to the gate oxide film for example of the transistor and thus early defectives could not be eliminated sufficiently. Further, in burn-in test, generally the semiconductor device is operated at low frequency. Therefore, it is sufficient that the current supplying capability of Vneg internal power supply generation circuit PG_N is a fraction of the capability in normal operation.

Thus, in the semiconductor device of the third embodiment of the present invention, in burn-in test, Vneg internal power supply generation circuit PG2_N to PG6_N stop supplying negative voltage Vneg, and only Vneg internal power supply generation circuit PG1_N supplies negative voltage Vneg to memory macros A1 to A6. Therefore, regarding the semiconductor device of the third embodiment of the present invention, the number of Vneg internal power supply generation circuits PG_N supplying negative voltage Vneg in burn-in test can be optimized and voltage variation and ripple of negative voltage Vpp can be minimized.

In the following, a further embodiment of the present invention is described in connection with the drawings. In the drawings, like or corresponding components are denoted by like reference characters and the description thereof is not repeated.

Fourth Embodiment

The present embodiment relates to a semiconductor device changing the cell plate voltage in burn-in test, as compared with the semiconductor device of the first embodiment. The configuration and operation of the semiconductor device, except for the features described below, are similar to those of the semiconductor device of the first embodiment.

Figure 22:
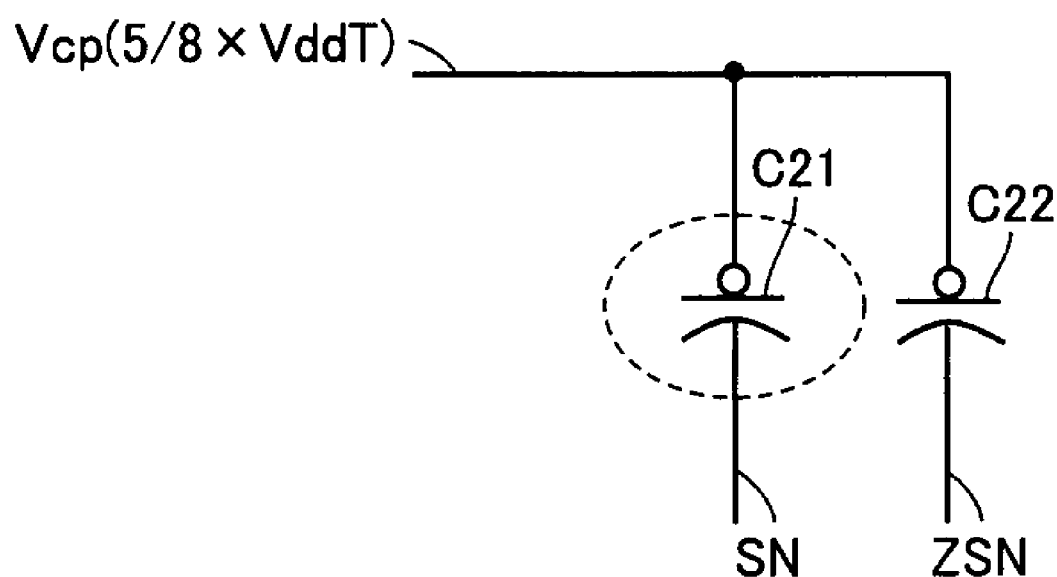
FIG. 22 shows a part of a memory cell shown in FIG. 9.

FIG. 22 shows a part of the memory cell shown in FIG. 9. FIG. 23 shows transition of the voltage between the storage node and Vcp in normal operation and in burn-in test.

A description is first given of the case where the voltage supply operation similar to that of normal operation is performed in burn-in test. In the following description, regarding the semiconductor device of the fourth embodiment of the present invention, it is supposed that external power supply voltage VddT is 1.2 V, boosted voltage Vpp is 1.6 V, negative voltage Vneg is −0.6 V, reference voltage Vref0 is 0.6 V, reference voltage VrefP is 0.8 V, reference voltage VrefN is 0.3 V, reference voltage VreEB is 0.6 V and reference voltage VrefC is 0.75 V in normal operation.

Figure 24:
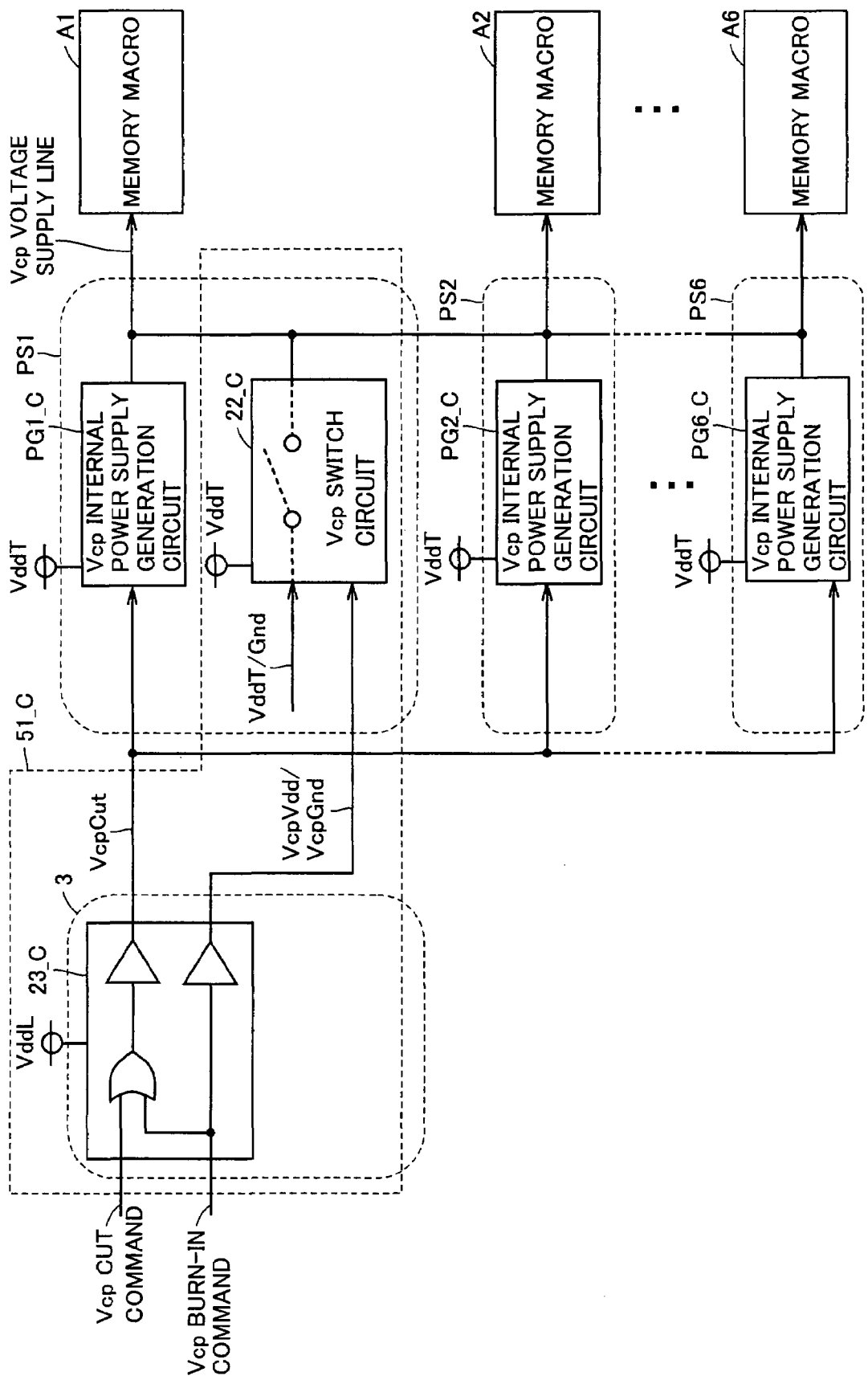
FIG. 24 shows a configuration of a Vcp burn-in circuit and its peripheral circuits according to a fourth embodiment of the present invention.

Referring to FIGS. 22 and 23, in normal operation, Vcp internal power supply generation circuit PG1_C shown FIG. 24 described hereinlater supplies to a memory cell capacitor, as intermediate voltage Vcp which is the cell plate voltage of the memory cell capacitor, 5/8×VddT determined by multiplying external power supply voltage VddT by 5/8. Therefore, to the memory cell capacitor storing electric charge corresponding to H data, the voltage between the storage node and Vcp, namely VddT (H data)−Vcp =VddT−5/8×VddT=3/8× VddT=0.45 V is applied. To the memory cell capacitor storing electric charge corresponding to L data, the voltage between the storage node and the Vcp, namely Vcp−GND (L data)=5/8×VddT=0.75 V is applied.

Here, in burn-in test, external power supply voltage VddT# of 1.9 V having a larger voltage value than external power supply voltage VddT in normal operation is supplied to the semiconductor device. As described above, however, since only the voltage lower than external power supply voltage VddT# is supplied to the memory cell capacitor, early defectives may not be eliminated sufficiently. However, if external power supply voltage VddT# in burn-in test is further increased for applying stress for revealing early failures to the memory cell capacitor, excessive stress could be applied to the logic thin film transistor of the memory macro for example to which external power supply voltage VddT# is supplied, possibly resulting in breakage of the gate oxide film for example of the transistor.

Further, in burn-in test, intermediate voltage Vcp having a different voltage value from that in normal operation may be supplied from the outside to apply stress to the memory capacitor for revealing early failures and thereby shortening the burn-in test time. However, in this case, a pad for supplying intermediate voltage Vcp for burn-in test has to be provided, resulting in increase in circuit size and area.

Then, for the semiconductor device of the fourth embodiment of the present invention, external power supply voltage VddT# is supplied to the memory macro instead of intermediate voltage Vcp in burn-in test so as to apply high electric field stress to the memory cell capacitor. In the following, the configuration and operation for performing burn-in test of the semiconductor device is described according to the fourth embodiment of the present invention.

FIG. 24 shows a configuration of a Vcp burn-in circuit and its peripheral circuits according to the fourth embodiment of the present invention.

Referring to FIG. 24, Vcp burn-in circuit 51_C includes a Vcp switch control circuit 23_C and a Vcp switch circuit 22_C. Vcp switch circuit 22_C is provided in power supply circuit portion PS1 only. Power supply circuit portions PS1 to PS6 include Vcp internal power supply generation circuits PG1_C to PG6_C. Vcp internal power supply generation circuit PG_C corresponds to a part of intermediate voltage generation circuit 15 shown in FIG. 2.

Vcp switch control circuit 23_C outputs, like Vpp switch control circuit 23_P, burn-in signal VcpVdd, burn-in signal VcpGnd and cut signal VcpCut based on the Vcp burn-in command and Vcp cut command.

Figure 25:
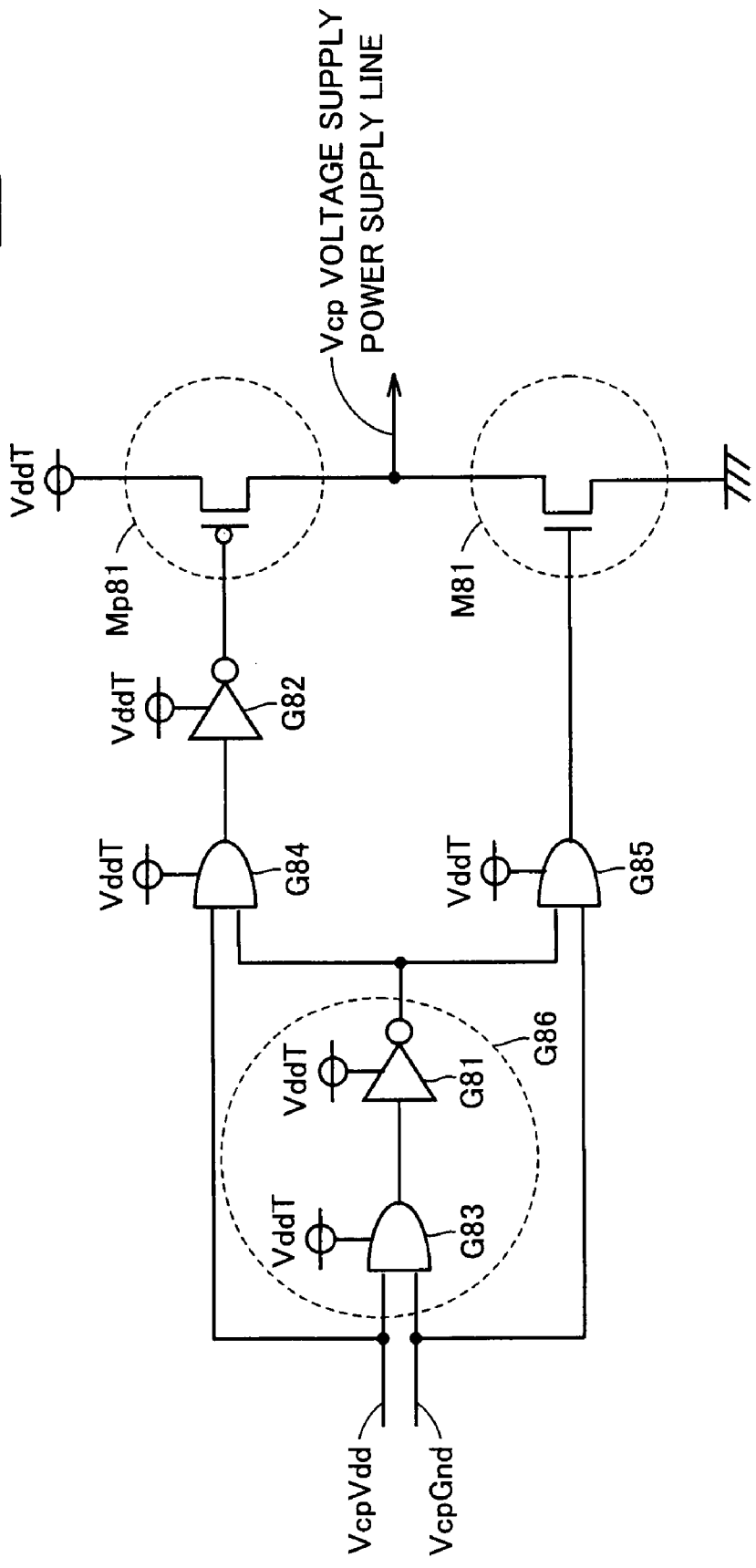
FIG. 25 is a circuit diagram showing a configuration of a Vcp switch circuit according to the fourth embodiment of the present invention.

FIG. 25 is a circuit diagram showing a configuration of the Vcp switch circuit in the fourth embodiment of the present invention. FIG. 26 shows a relation between the burn-in signals and the voltage supplied to the Vcp voltage supply line.

Referring to FIG. 25, Vcp switch circuit 22_C includes a P-channel MOS transistor (switch transistor) Mp81, an N-channel MOS transistor (switch transistor) M81, inverters G81 to G82 and AND gates G83 to G85 and is configured with thin film transistors for logic applications.

Burn-in signal VcpVdd from Vcp switch control circuit 23_C is input to AND gates G83 to G84. Burn-in signal VcpGnd from Vcp switch control circuit 23_C is input to AND gates G83 and G85. The output of AND gate G83 is connected to the input of inverter G81. The output of inverter G81 is connected to AND gates G84 to G85. The output of AND gate G84 is connected to the input of inverter G82. The output of inverter G82 is connected to the gate of P-channel MOS transistor Mp81. The output of AND gate G85 is connected to the gate of N-channel MOS transistor M81. To the connection point of the drain of P-channel MOS transistor Mp81 and the drain of N-channel MOS transistor M81, the Vcp voltage supply line is connected. The source of P-channel MOS transistor Mp81 is connected to external power supply voltage VddT. The source of N-channel MOS transistor M81 is connected to the ground voltage.

Normal operation is described first. Referring to FIGS. 25 and 26, in normal operation, burn-in signals VcpVdd and VcpGnd are set to GND level. Therefore, the output of inverter G82 has VddT level, the output of AND gate G85 has GND level and P-channel MOS transistor Mp81 and N-channel MOS transistor M81 are OFF. Further, since there is the relation VddT>Vcp, the backgate of P-channel MOS transistor Mp81 is connected to VddT. Therefore, the Vcp voltage supply line, external power supply voltage VddT and ground voltage GND are electrically separated. Further, to the Vcp voltage supply line, Vcp internal power supply generation circuit PG_C supplies intermediate voltage Vcp.

In contrast, in burn-in test, burn-in signal VcpVdd or VcpGnd is set to VddL level (H level). In the case where burn-in signal VcpVdd is set to VddL level, the output of inverter G82 has GND level and P-channel MOS transistor Mp81 is ON. Thus, to the Vcp voltage supply line, Vcp switch circuit 22_C supplies external power supply voltage VddT.

In the case where burn-in signal VcpGnd is set to VddL level, the output of AND gate G85 has VddT level and N-channel MOS transistor M81 is ON. Thus, to the Vcp voltage supply line, ground voltage GND from Vcp switch circuit 22_C is supplied.

Referring again to FIGS. 22 and 23, for the semiconductor device of the fourth embodiment of the present invention, in burn-in test, external power supply voltage VddT or ground voltage GND is supplied to the memory cell capacitor via the Vcp voltage supply line instead of supplying intermediate voltage Vcp. Therefore, in the case where burn-in signal VcpVdd is set to VddL level, the storage node—Vcp voltage of 1.9 V is applied to the memory cell capacitor storing electric charge corresponding to L data. In the case where burn-in signal VcpGnd is set to VddL level, the storage node—Vcp voltage of 1.9 V is applied to the memory cell capacitor storing electric charge corresponding to H data. Thus, as compared with the configuration to perform, in burn-in test, the voltage supply operation similar to that of normal operation, high electric field stress can be applied to the memory cell capacitor.

Referring again to FIG. 25, AND gate G83 and inverter G81 correspond to an EXOR circuit to constitute a fail-safe circuit G86. In other words, even if both of the burn-in signals VcpVdd and VcpGnd are simultaneously activated erroneously, P-channel MOS transistor Mp81 and N-channel MOS transistor M81 are not ON. Thus, through current can be prevented from flowing between external power supply voltage VddT and ground voltage GND.

Further, Vcp switch circuit 22_C has the logic circuit configuration to provide L level of burn-in signals VcpVdd and VcpGnd in normal operation. With this configuration, even if the power supply level of burn-in signals VcpVdd and VcpGnd (VddL for example) and the power supply level of Vcp switch circuit 22_C (VddT for example) differ from each other (VddL<VddT), leakage current can be prevented from flowing through AND gates G83 to G85.

Figure 27:
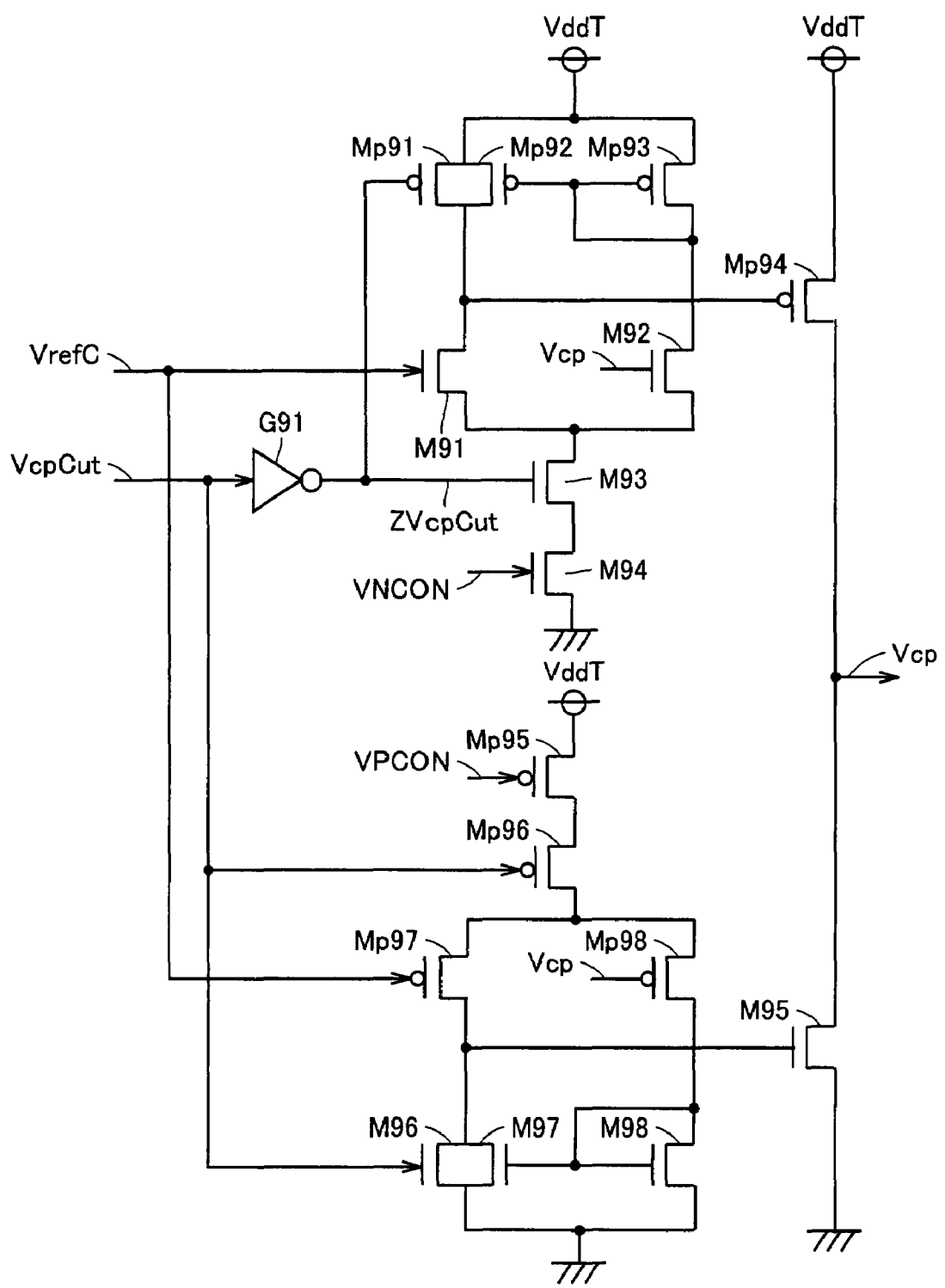
FIG. 27 is a circuit diagram showing a configuration of a Vcp internal power supply generation circuit according to the fourth embodiment of the present invention.

FIG. 27 is a circuit diagram showing a configuration of a Vcp internal power supply generation circuit according to the fourth embodiment of the present invention.

Referring to FIG. 27, the Vcp internal power supply generation circuit PG-C includes P-channel MOS transistors Mp91 to Mp98, N-channel MOS transistors M91 to M98 and an inverter G91.

Reference voltage VrefC is input to the gate of N-channel MOS transistor M91 and the gate of P-channel MOS transistor Mp97. Cut signal VcpCut is input to inverter G91, the gate of P-channel MOS transistor Mp96 and the gate of N-channel MOS transistor M96. The output of inverter G91 is connected to the gate of P-channel MOS transistor Mp91 and the gate of N-channel MOS transistor M93. Constant current VPCON is input to the gate of P-channel MOS transistor Mp95. Constant current VNCON is input to the gate of N-channel MOS transistor M94. The drains of P-channel MOS transistors Mp91 to Mp92, the gate of P-channel MOS transistor Mp94 and the drain of N-channel MOS transistor M91 are connected. The gate of P-channel MOS transistor Mp92, the gate and drain of P-channel MOS transistor Mp93 and the drain of N-channel MOS transistor M92 are connected. The sources of N-channel MOS transistors M91 to M92 and the drain of N-channel MOS transistor M93 are connected. The source of N-channel MOS transistor M93 and the drain of N-channel MOS transistor M94 are connected. The drain of P-channel MOS transistor Mp95 and the source of P-channel MOS transistor Mp96 are connected. The drain of P-channel MOS transistor Mp96 and the sources of P-channel MOS transistors Mp97 to Mp98 are connected. The drain of P-channel MOS transistor Mp97, the drains of N-channel MOS transistors M96 to M97 and the gate of N-channel MOS transistor M95 are connected. The gate of N-channel MOS transistor M97, the gate and drain of N-channel MOS transistor N98 and the drain of P-channel MOS transistor Mp98 are connected. To the connection point of the drain of P-channel MOS transistor Mp94 and the drain of N-channel MOS transistor M95, the Vcp voltage supply line is connected.

The sources of P-channel MOS transistors Mp91 to Mp95 are connected to external power supply voltage VddT. The sources of N-channel MOS transistors M94 to M98 are connected to the ground voltage.

In the case where cut signal VcpCut has H level, a signal of L level is supplied to the gate of P-channel MOS transistor Mp91, and a signal of H level is supplied to the gate of P-channel MOS transistor Mp94. Therefore, P-channel MOS transistor Mp94 is OFF. In the case where cut signal VcpCut has H level, a signal of H level is supplied to the gate of N-channel MOS transistor M96 and a signal of L level is supplied to the gate of N-channel MOS transistor M95. Therefore, N-channel MOS transistor M95 is OFF. With this configuration, in burn-in test, it can be prevented that the output of Vcp internal power supply generation circuit PG_C and external power supply voltage VddT or ground voltage GND are simultaneously output to the Vcp voltage supply line.

As seen from the above, for the semiconductor device of the fourth embodiment of the present invention, in burn-in test, instead of supplying intermediate voltage Vcp, external power supply voltage VddT or ground voltage GND is supplied to the memory cell capacitor via the Vcp voltage supply line, namely a voltage higher than or lower than intermediate voltage Vcp is supplied to the memory cell capacitor. More specifically, in the case where the memory cell capacitor stores electric charge corresponding to L data, external power supply voltage VddT is supplied to a common electrode opposite to the storage node. In the case where the memory cell capacitor stores electric charge corresponding to H data, ground voltage GND is supplied to the common electrode opposite to the storage node. With this configuration, high electric field stress of the level of external power supply voltage VddT can be applied to the memory cell capacitor and stress for revealing early failure can be applied to the gate oxide film of the memory cell capacitor. Therefore, the time required for burn-in test can be shortened and early defectives can be eliminated sufficiently. In other words, regarding the semiconductor device of the fourth embodiment of the present invention, like the semiconductor device of the first embodiment, the defect detection test can be performed appropriately.

Further, since Vcp switch circuit 22_C is configured with thin film transistors for logic applications, the current driving ability per unit area is higher and the layout area can be reduced as compared with the conventional logic-merged memory circuit configured with thick film transistors. Furthermore, since Vcp switch circuit 22_C is driven by the low power supply for logic applications that is external power supply voltage VddT, it is unnecessary for the configuration to address such problems as latch up due to the order of supplying power by the high power supply for thick film transistors and the low power supply for logic applications as well as circuit malfunction.

Here, according to the result of evaluation of the actual device, it is shown that, in the memory cell, high resistance short circuit, due to a foreign matter, between intermediate voltage Vcp and external power supply voltage VddT applied to the N well substrate of the P-channel MOS transistor could cause standby current of a few mA (usually a few μA). In addition, since intermediate voltage Vcp is used as a gate voltage of the memory cell capacitor formed of a thin film transistor, there is large off-leakage current due to, for example, gate leakage of the thin film transistor. In particular, in the state where a high voltage is applied to a memory cell as in burn-in test, larger off-leakage current flows. Therefore, in order to avoid shortage of the supply current in burn-in test, the size of the switching transistor of Vcp switch circuit 22_C is preferably the one that can address the problem of the off-leakage current.

FIG. 28 shows the states of transition of the externally supplied voltage and the voltage generated in the internal circuit in normal operation and burn-in test of the semiconductor devices according to the first, second and fourth embodiments of the present invention.

Referring to FIG. 28, for the semiconductor device of the first embodiment of the present invention, external power supply voltage VddT (1.9 V) is supplied, instead of boosted voltage Vpp (2.3 V), to the Vpp voltage supply line in burn-in test. For the semiconductor device of the second embodiment of the present invention, ground voltage GND (0 V) is supplied, instead of negative voltage Vneg (−0.6 V), to the Vneg voltage supply line in burn-in test. For the semiconductor device of the fourth embodiment of the present invention, external power supply voltage VddT (1.9 V) or ground voltage GND (0 V) is supplied, instead of intermediate voltage Vcp (approximately 1.19 V), to the Vcp voltage supply line in burn-in test.

In the following, a further embodiment of the present invention is described in connection with the drawings. In the drawings, like or corresponding components are denoted by like reference characters and the description thereof is not repeated.

Fifth Embodiment

The present embodiment relates to a semiconductor device additionally having control over memory cells in burn-in test, as compared with the semiconductor device of the fourth embodiment. The configuration and operation of the semiconductor device, except for the features described below, are similar to those of the semiconductor device of the fourth embodiment.

Figure 29:
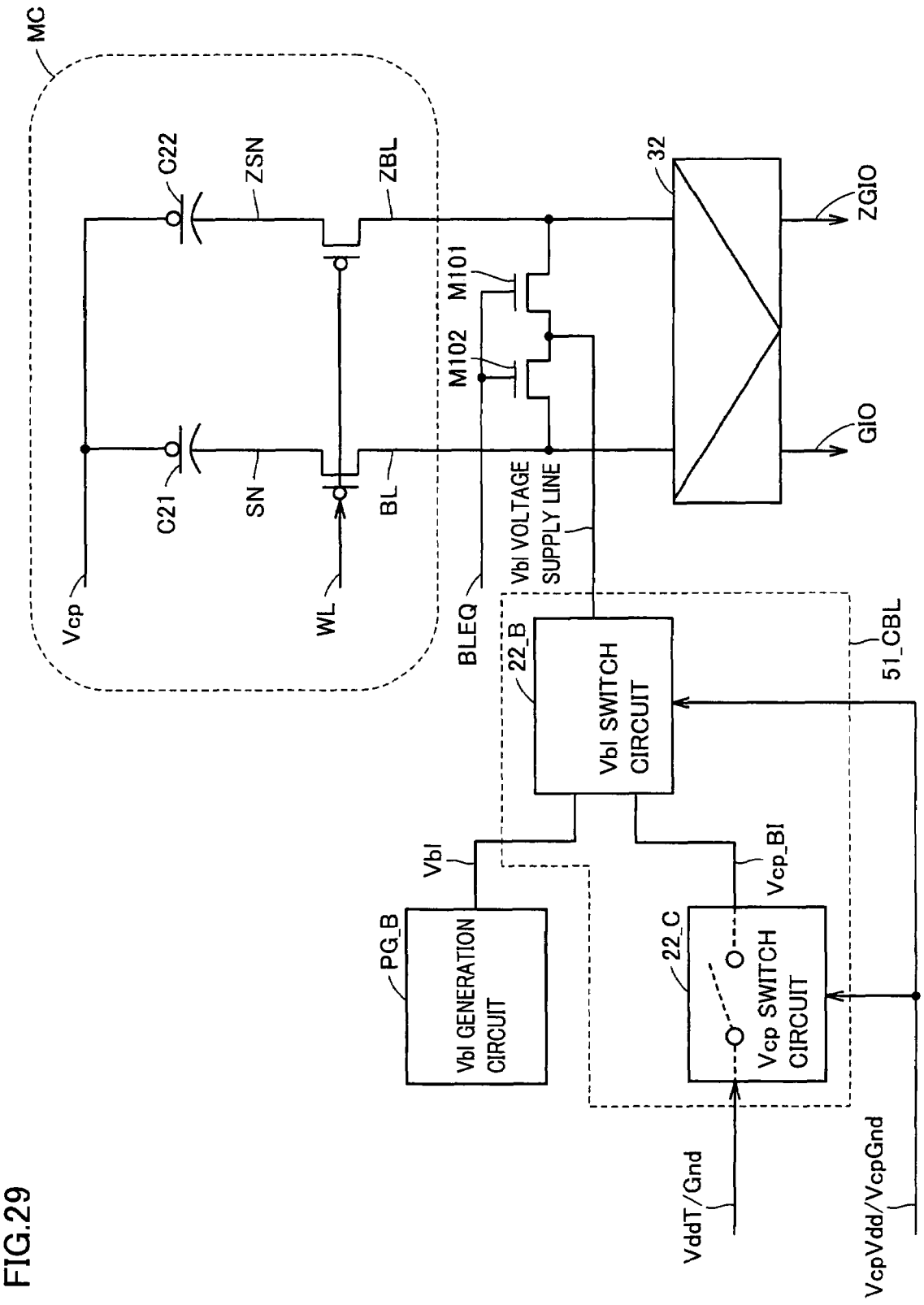
FIG. 29 shows a configuration of a Vcp burn-in via Vbl circuit as well as its peripheral circuits according to a fifth embodiment of the present invention.

FIG. 29 shows a configuration of a Vcp burn-in via Vbl circuit and its peripheral circuits according to the fifth embodiment of the present invention.

Referring to FIG. 29, Vcp burn-in via Vbl circuit 51_CBL further includes a Vbl switch circuit 22_B as compared with Vcp burn-in circuit 51_C shown in FIG. 24. The memory macro further includes N-channel MOS transistors (BLEQ transistors) M101 to M102. Power supply circuit portion PS includes a Vbl internal power supply generation circuit PG_B. Vbl internal power supply generation circuit PG_B corresponds to a part of intermediate voltage generation circuit 15 shown in FIG. 2.

Vbl switch circuit 22_B supplies, based on burn-in signals VcpVdd and VcpGnd supplied from Vcp switch control circuit 23_C, intermediate voltage Vbl from Vbl internal power supply generation circuit PG_B or voltage Vcp_BI from Vcp switch circuit 22_C to a Vbl voltage supply line.

Figure 30:
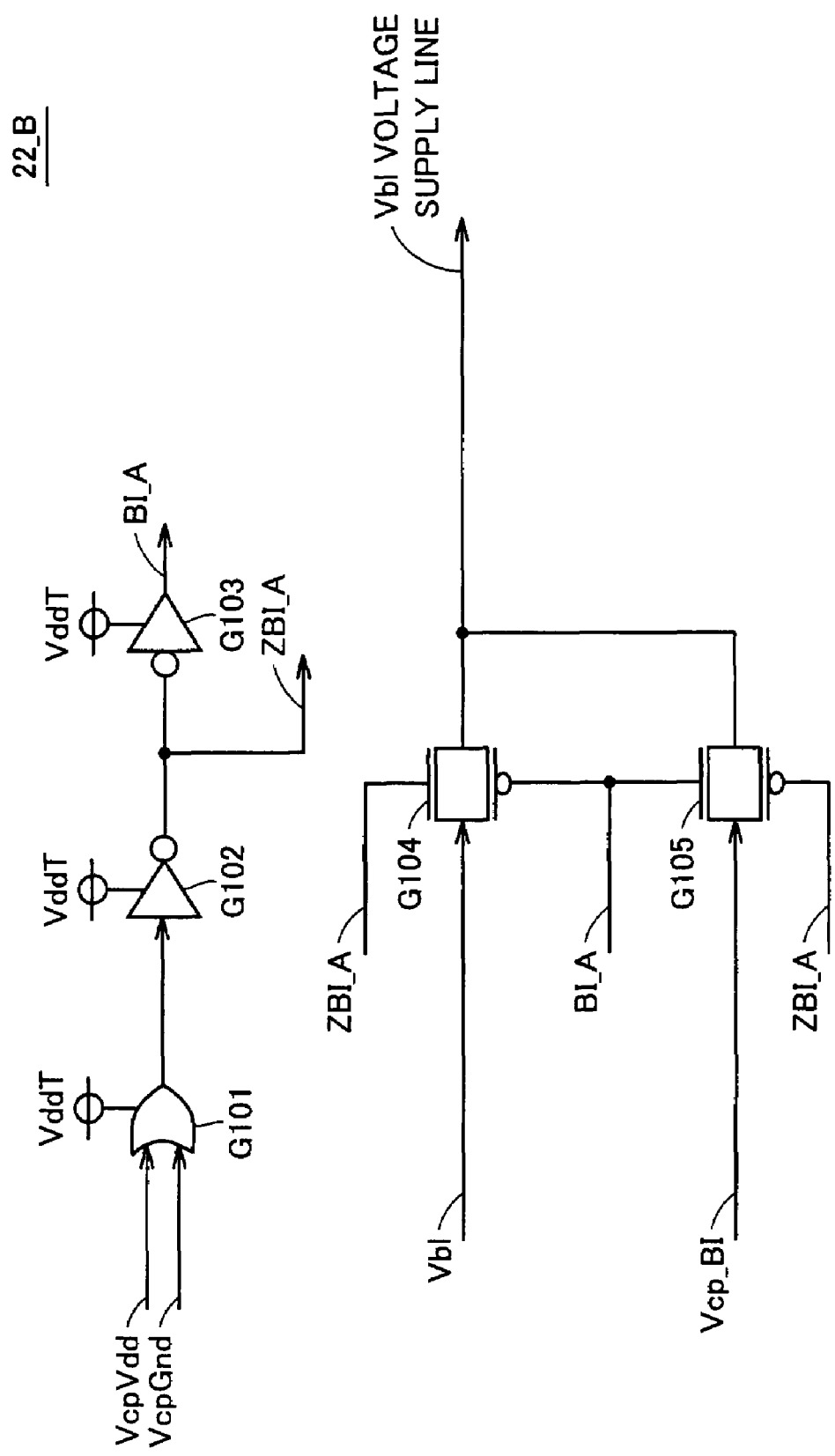
FIG. 30 is a circuit diagram showing a configuration of a Vbl switch circuit according to the fifth embodiment of the present invention.

FIG. 30 is a circuit diagram showing a configuration of the Vbl switch circuit according to the fifth embodiment of the present invention.

Referring to FIG. 30, Vbl switch circuit 22_B includes transfer gates G104 to G105, an OR gate G101 and inverters G102 to G103, and is configured with thin film transistors for logic applications.

Normal operation is described first. In normal operation, burn-in signals VcpVdd and VcpGnd are set to GND level. Therefore, transfer gate G105 is OFF while transfer gate G104 is ON. Accordingly, intermediate voltage Vbl from Vbl internal power supply generation circuit PG_B is supplied to the Vbl voltage supply line.

Next, burn-in test is described. In burn-in test, burn-in signal VcpVdd or VcpGnd is set to VddL level. Therefore, transfer gate G104 is OFF while transfer gate G105 is ON. Accordingly, external power supply voltage VddT or ground voltage GND from Vcp switch circuit 22_C is supplied to the Vbl voltage supply line.

In burn-in test, control circuit 35 of the memory macro outputs precharge signal BLEQ having the level of boosted voltage Vpp to the gates of BLEQ transistors M101 to M102. Further, control circuit 35 controls row decoder 33L to supply negative voltage Vneg to word line WL.

Then, BLEQ transistors M101 to M102 are ON and access transistors Mp21 to Mp22 are ON. Therefore, the data having the same logic level is written to memory cell capacitors C21 to C22. More specifically, external power supply voltage VddT or ground voltage GND from Vbl switch circuit 22_B is supplied via bit line BL and bit line ZBL to memory cell capacitors C21 to C22 and, in memory cell capacitors C21 to C22, electric charges corresponding to the same logic level are stored.

It should be recalled that the semiconductor device of the fourth embodiment of the present invention is configured to supply external power supply voltage VddT or ground voltage GND to the Vcp voltage supply line in burn-in test so as to apply high electric field stress to memory cell capacitors. However, in the case where the memory cell has the twin cell structure, normal complementary data is stored in memory cell capacitors C21 to C22. Thus, if external power supply voltage VddT is supplied to the Vcp voltage supply line, stress is applied to only the memory cell capacitor storing L data. In contrast, if ground voltage GND is supplied to the Vcp voltage supply line, stress is applied to only the memory cell capacitor storing H data. Therefore, regarding the semiconductor device of the fourth embodiment of the present invention, in order to apply high electric field stress to any memory cell capacitors, external power supply voltage VddT and ground voltage GND have to be supplied separately to the Vcp voltage supply line, resulting in the problem of longer burn-in test time.

In contrast, regarding the semiconductor device of the fifth embodiment of the present invention, data having the same logic level can be written to memory cell capacitors C21 to C22 and thus the time for the burn-in test can be shortened. Accordingly, for the semiconductor device of the fifth embodiment of the present invention, the burn-in test can be performed efficiently.

In the following, a further embodiment of the present invention is described in connection with the drawings. In the drawings, like or corresponding components are denoted by like reference characters and the description thereof is not repeated.

Sixth Embodiment

The present embodiment relates to a semiconductor device additionally having control over memory cells in burn-in test, as compared with the semiconductor device of the fourth embodiment. The configuration and operation of the semiconductor device, except for the features described below, are similar to those of the semiconductor device of the fourth embodiment.

Referring to FIG. 9, in the case where burn-in test is performed in which burn-in signal VcpVdd is set to VddL level, control circuit 35 of the memory macro controls row decoder 33L to supply negative voltage Vneg to word lines WL associated with all memory cells of memory array 31, in order to make access transistors Mp21 and Mp22 ON. Then, control circuit 35 controls sense amplifier portion 32 to write L level data in predetermined cycles to all memory cells of memory array 31. Namely, electric charges corresponding to L level are stored in memory cell capacitors C21 to C22.

In contrast, in the case where burn-in test is performed in which burn-in signal VcpGnd is set to L level, control circuit 35 of the memory macro controls sense amplifier portion 32 to write H level data in predetermined cycles to all memory cells of memory array 31. Namely, electric charges corresponding to H level are stored in memory cell capacitors C21 to C22. In this case, control circuit 35 controls row decoder 33L to supply ground voltage GND to word lines WL associated with all memory cells of memory array 31 for the following reason. In the case where H data is stored in the memory cell capacitor, it is sufficient that ground voltage GND is supplied to word line WL for suppressing capacitor leakage.

It should be noted that, in burn-in test, electric charge stored in the memory cell capacitor to which data is written could flow out as time passes to cause capacitor leakage current to flow and thereby cause the stress applied to the memory cell capacitor to be alleviated. In particular, for a thin film transistor having a small gate voltage for making the transistor ON, this is a problem. However, for the semiconductor device of the sixth embodiment of the present invention, control circuit 35 allows data of a predetermined logic level to be written in predetermined cycles to all memory cells of memory array 31 in burn-in test. With this configuration, it can be prevented that the stress applied to the memory cell capacitor is alleviated and thus burn-in test can be performed stably.

The semiconductor device of the sixth embodiment of the present invention has been described as the one configured to have control circuit 35 controlling sense amplifier portion 32 to write data of a predetermined logic level in predetermined cycles to all memory cells of memory array 31, the present invention is not limited to this. A semiconductor device configured similarly to the semiconductor device of the fifth embodiment may have control circuit 35 that outputs, in burn-in test, precharge signal BLEQ having the level of boosted voltage Vpp to the gates of BLEQ transistors M101 to M102 and Vbl switch circuit 22_B may output external power supply voltage VddT or ground voltage GND to BLEQ transistors M101 to M102. With this configuration, data of the same logic level is written to memory cell capacitors C21 to C22 so that burn-in test time can be shortened and burn-in test can be performed stably.

Further, although the semiconductor device of the sixth embodiment of the present invention is configured to have control circuit 35 allowing data to be written to all memory cells of memory array 31 and a predetermined voltage to be supplied to word line WL, the semiconductor device may be configured to control in the above-described manner, not all the memory cells of memory array 31, but some of the memory cells.

In the following, a further embodiment of the present invention is described in connection with the drawings. In the drawings, like or corresponding components are denoted by like reference characters and the description thereof is not repeated.

Seventh Embodiment

The present embodiment relates to a semiconductor device additionally having a voltage conversion circuit as compared with the semiconductor device of the first embodiment. The configuration and operation of the semiconductor device, except for the features described below, are similar to those of the semiconductor device of the first embodiment.

Figure 31:
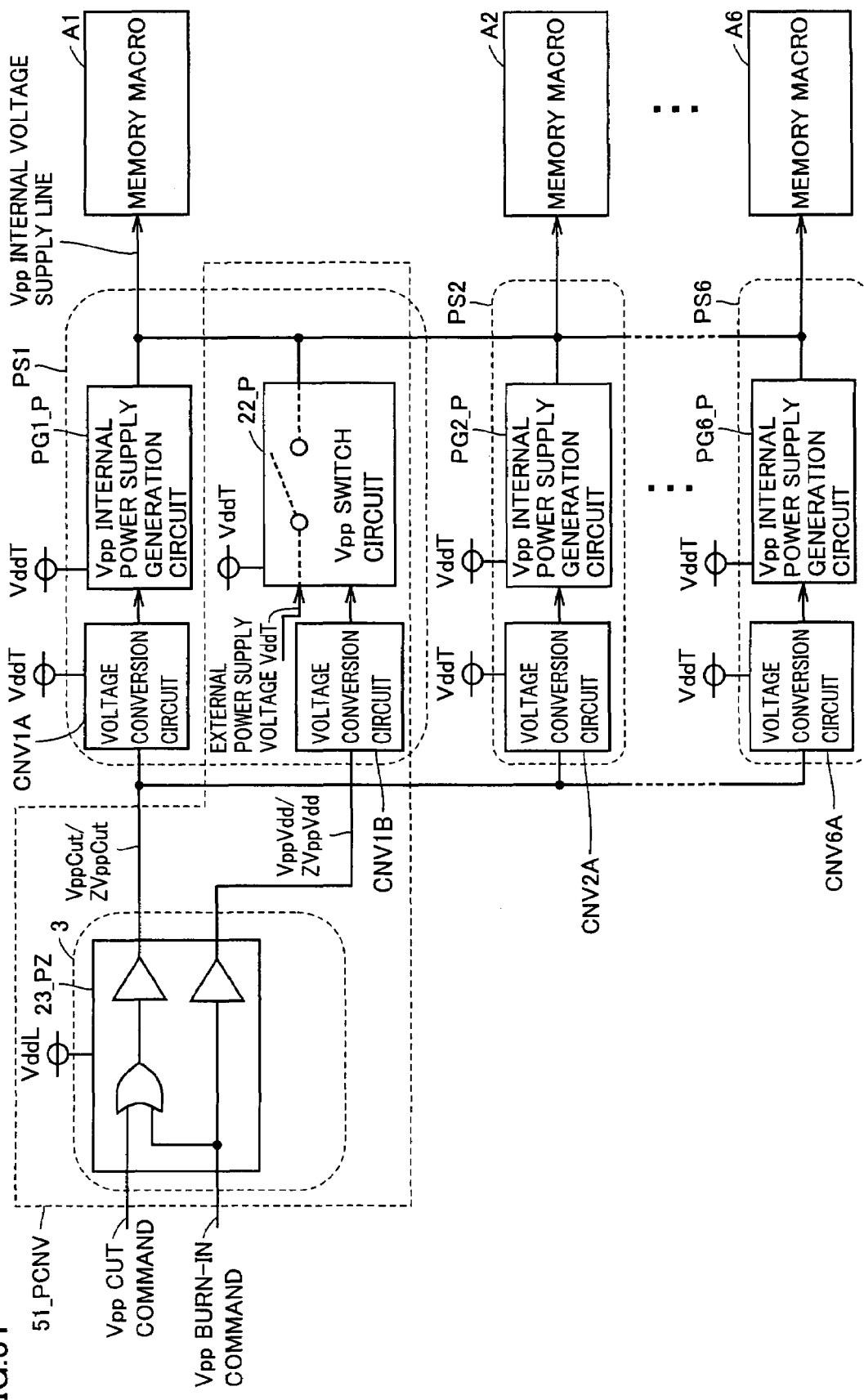
FIG. 31 shows a configuration of a Vpp burn-in circuit and its peripheral circuits according a seventh embodiment of the present invention.

FIG. 31 shows a configuration of a Vpp burn-in circuit and its peripheral circuits according to the seventh embodiment of the present invention.

Referring to FIG. 31, Vpp burn-in circuit 51_PCNV includes, as compared with Vpp burn-in circuit 51_P shown in FIG. 13, a Vpp switch control circuit 23_PZ instead of Vpp switch control circuit 23_P and additionally includes voltage conversion circuit CNV1B. Power supply circuit portions PS1 to PS6 further include, as compared with power supply circuit portions PS1 to PS6 shown in FIG. 13, voltage conversion circuits CNV1A to CNV6A.

Vpp switch control circuit 23_PZ outputs, based on the Vpp cut command and Vpp burn-in command, complementary cut signals VppCut and ZVppCut as well as complementary burn-in signals VppVdd and ZVppVdd.

Figure 32:
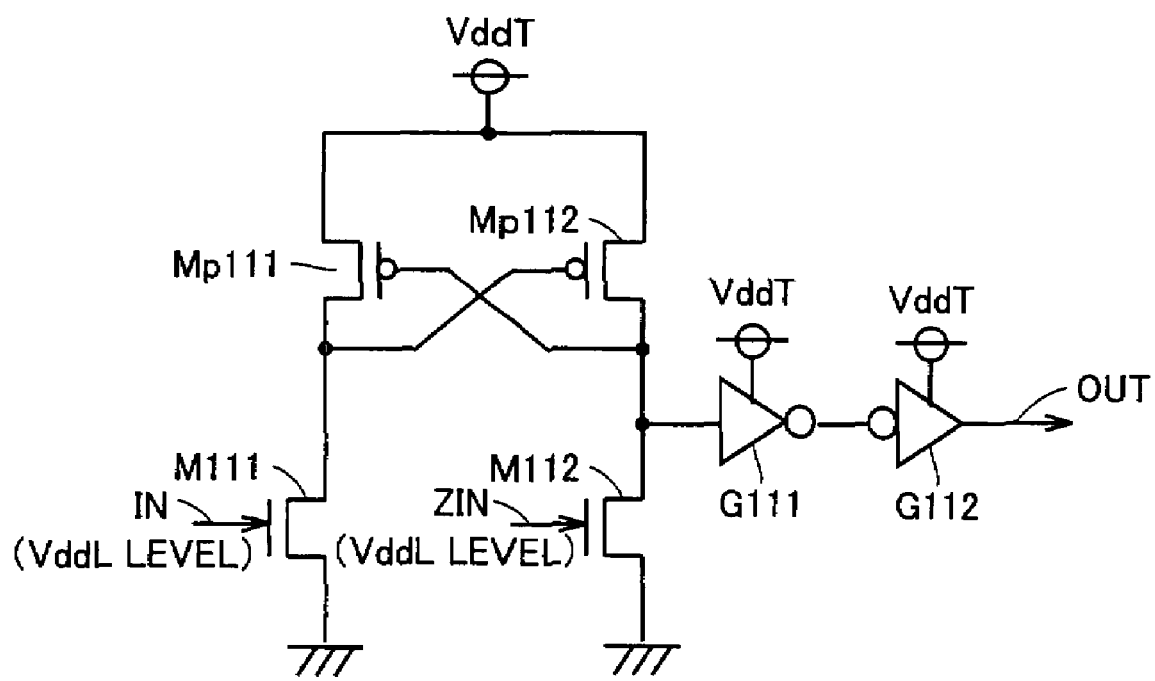
FIG. 32 is a circuit diagram showing a configuration of a voltage conversion circuit according to the seventh embodiment of the present invention.

FIG. 32 is a circuit diagram showing a configuration of the voltage conversion circuit according to the seventh embodiment of the present invention. Referring to FIG. 32, voltage conversion circuit CNV includes P-channel MOS transistors Mp111 to Mp112, N-channel MOS transistors M111 to M112 and inverters G111 to G112.

To the gate of N-channel MOS transistor M11, cut signal VppCut or burn-in signal VppVdd is input. To the gate of N-channel MOS transistor M112, cut signal ZVppCut or burn-in signal ZVppVdd is input. To the drain of N-channel MOS transistor M111, the drain of P-channel MOS transistor Mp111 and the gate of P-channel MOS transistor Mp112 are connected. To the drain of N-channel MOS transistor M112, the drain of P-channel MOS transistor Mp112, the gate of P-channel MOS transistor Mp111 and the input of inverter G111 are connected. The output of inverter G111 and the input of inverter G112 are connected. The output of inverter G112 is the output of voltage conversion circuit CNV. The sources of N-channel MOS transistors M111 to M112 are connected to the ground voltage. The sources of P-channel MOS transistors Mp111 to Mp112 are connected to external power supply voltage VddT. The power supply level of inverters G111 to G112 is external power supply voltage VddT.

The logic level of the output signal of inverter G112 is determined according to the logic level of the input complementary signal, and the voltage level of the output signal of inverter G112 is external power supply voltage VddT regardless of external power supply voltage VddL for logic applications that is the power supply level of the input complementary signal. In other words, voltage conversion circuit CNV performs voltage conversion on the burn-in signal and the cut signal having the level of external power supply voltage VddL for the logic circuit into signals having the level of external power supply voltage VddT for the memory.

It should be recalled that the semiconductor device of the first embodiment of the present invention has Vpp switch circuit 22_P shown in FIG. 12 for example that sets, in burn-in test, burn-in signal VppVdd to VddL level. Therefore, in the case where the power supply level (VddL for example) of burn-in signal VppVdd and the power supply level (VddT for example) of Vpp switch circuit 22_P differ from each other (VddL<VddT), leakage current could flow through inverter G33.

In wafer-level burn-in test, generally external power supply voltage VddL (1.6 V for example) for logic applications and external power supply voltage VddT (2.4 V for example) for memory are considerably different from each other. In this case, if the P/N ratio of inverter G33 provided in the first stage of the input of Vpp switch circuit 22_P, namely the channel width of the P-channel MOS transistor of inverter G33 is larger than the channel width of the N-channel MOS transistor, inverter G33 erroneously determines that burn-in signal VppVdd having VddL level is L level, and thus external power supply voltage VddT is not output from Vpp switch circuit 22_P to the Vpp voltage supply line.

In contrast, the semiconductor device of the seventh embodiment of the present invention has voltage conversion circuit CNV that performs voltage conversion on burn-in signal Vpp having the level of external power supply voltage VddL for logic applications into a signal having the level of external power supply voltage VddT for memory. With this configuration, the leakage current and malfunction of Vpp switch circuit 22_P can be prevented, the power consumption in burn-in test can be reduced and burn-in test can be performed stably.

In the semiconductor device of the seventh embodiment of the present invention, in the preceding stage of the circuits relevant to boosted voltage Vpp, namely the Vpp burn-in circuit and Vpp internal power supply generation circuit, voltage conversion circuit CNV is provided. The present invention, however, is not limited to this. For circuits relevant to negative voltage Vneg and intermediate voltage Vcp, voltage conversion circuit CNV may be provided. Further, voltage conversion may be performed on other control signals that are output from logic circuit portion 3 to the memory macro or power supply circuit portion PS.

The semiconductor devices according to the first to seventh embodiments may be implemented in the form of an appropriate combination.

Further, the voltage values of external power supply voltage VddT, external power supply voltage VddL, boosted voltage Vpp, external power supply voltage VddT# and boosted voltage Vpp# in burn-in test, negative voltage Vneg, intermediate voltage Vcp and intermediate voltage Vbl for example are provided by way of example and illustration and thus they may be other voltage values.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a first operation mode and a second operation mode in which a positive voltage and a ground voltage are externally supplied and the positive voltage in said second operation mode is higher than the positive voltage in said first operation mode, comprising:
a memory portion including a memory cell storing data; and
a power supply circuit portion supplying a first voltage and a second voltage to said memory portion, wherein
said memory portion writes data to or reads data from said memory cell based on said first voltage and said second voltage, and
said power supply circuit portion includes:
a boosted voltage generation circuit generating, based on said externally supplied positive voltage and ground voltage, a boosted voltage of said positive voltage;
a negative voltage generation circuit generating a negative voltage based on said externally supplied positive voltage and ground voltage; and
a switch circuit supplying, in said first operation mode, said boosted voltage as said first voltage and said negative voltage as said second voltage to said memory portion, and providing, in said second operation mode, a smaller voltage difference between said first voltage and said second voltage relative to said first operation mode.

2. The semiconductor device according to claim 1, wherein said switch circuit supplies, in said second operation mode, said externally supplied positive voltage as said first voltage and said negative voltage as said second voltage to said memory portion.

3. The semiconductor device according to claim 1, wherein said switch circuit supplies, in said second operation mode, said boosted voltage as said first voltage and said externally supplied ground voltage as said second voltage to said memory portion.

4. The semiconductor device according to claim 1, wherein
in a case where data is not to be written to said memory cell and data is not to be read from said memory cell, said memory portion supplies said first voltage to an electric current line connected to said memory cell and,
in a case where data is to be written to said memory cell or data is to be read from said memory cell, said memory portion supplies said second voltage to the electric current line connected to said memory cell.

5. A semiconductor device having a first operation mode and a second operation mode in which a positive voltage and a ground voltage are externally supplied and the positive voltage in said second operation mode is higher than the positive voltage in said first operation mode, comprising:
a memory portion including a memory cell storing data; and
a power supply circuit portion supplying a voltage to said memory portion, wherein
said memory cell stores electric charge according to a logic level of data and includes a first memory cell capacitor and a second memory cell capacitor having a common electrode, and
said power supply circuit portion includes:
a cell plate voltage generation circuit generating a cell plate voltage based on said externally supplied positive voltage and ground voltage; and
a cell plate voltage switch circuit supplying said cell plate voltage to the common electrode of said first and second memory cell capacitors in said first operation mode and supplying a voltage higher or lower than said cell plate voltage to said common electrode in said second operation mode.

6. The semiconductor device according to claim 5, wherein said cell plate voltage switch circuit supplies said externally supplied positive voltage or ground voltage to said common electrode in said second operation mode.

7. The semiconductor device according to claim 5, wherein said memory portion stores electric charge corresponding to the same logic level in said first and second memory cell capacitors in said second operation mode.

8. The semiconductor device according to claim 7, wherein said power supply circuit portion further includes a precharge voltage generation circuit generating a precharge voltage based on said externally supplied positive voltage and ground voltage, said memory portion further includes a precharge voltage switch circuit supplying said precharge voltage to electrodes other than the common electrode of said first and second memory cell capacitors in said first operation mode, and supplying a voltage higher or lower than said precharge voltage to the electrodes other than the common electrode of said first and second memory cell capacitors in said second operation mode.

9. The semiconductor device according to claim 8, wherein said precharge voltage switch circuit supplies said externally supplied positive voltage or ground voltage to the electrodes other than the common electrode of said first and second memory cell capacitors in said second operation mode.

10. The semiconductor device according to claim 5, wherein said memory portion includes a plurality of memory cells storing data, and stores electric charge corresponding to a predetermined logic level in predetermined cycles in said first and second memory cell capacitors of said plurality of memory cells in said second operation mode.

* * * * *